United States Patent
Ogura et al.

(10) Patent No.: US 10,439,054 B2
(45) Date of Patent: Oct. 8, 2019

(54) INSULATED GATE BIPOLAR TRANSISTOR

(71) Applicants: Kabushiki Kaisha Toshiba, Minato-ku, Tokyo (JP); Toshiba Electronic Devices & Storage Corporation, Minato-ku, Tokyo (JP)

(72) Inventors: Tsuneo Ogura, Kamakura Kanagawa (JP); Tomoko Matsudai, Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 15/916,518

(22) Filed: Mar. 9, 2018

(65) Prior Publication Data

US 2019/0006495 A1    Jan. 3, 2019

(30) Foreign Application Priority Data

Jun. 29, 2017    (JP) ................................ 2017-127476
Feb. 28, 2018    (JP) ................................ 2018-035431

(51) Int. Cl.
  *H01L 29/66*    (2006.01)
  *H01L 29/739*    (2006.01)
  (Continued)

(52) U.S. Cl.
  CPC ........ *H01L 29/7397* (2013.01); *H01L 29/407* (2013.01); *H01L 29/4236* (2013.01);
  (Continued)

(58) Field of Classification Search
  USPC ................................ 257/135–136, 242, 329,
  257/E27.095–E27.096, E29.118, E29.274,
  257/E29.313, E29.318, E29.262, 330,
  257/320, 328, 270, 271, 341, 331, 301,
  257/E21.345, E29.113, E29.148, E29.066,
  (Continued)

(56) References Cited

U.S. PATENT DOCUMENTS 7,642,597 B2    1/2010    Saito
7,928,505 B2    4/2011    Hirao et al.
(Continued)

FOREIGN PATENT DOCUMENTS

JP    2008-124346 A    5/2008
JP    2009-135360 A    6/2009
(Continued)

*Primary Examiner* — Niki H Nguyen
(74) *Attorney, Agent, or Firm* — White & Case LLP

(57) ABSTRACT

According to one embodiment, an IGBT has a first semiconductor layer of a first conductivity type, a second semiconductor layer of a second conductivity type, a third semiconductor layer of the second conductivity type, a fourth semiconductor layer of the first conductivity type, and a fifth semiconductor layer of the second conductivity type, between a first electrode and a second electrode, on the first electrode in order. A third electrode is provided on the third semiconductor layer, the fourth semiconductor layer, and the fifth semiconductor layer via a gate insulating film, and is insulated from the first electrode and the second electrode. A fourth electrode is provided between the third electrode and the second semiconductor layer, and is insulated from the third electrode and the second semiconductor layer.

7 Claims, 21 Drawing Sheets

(51) Int. Cl.
*H01L 29/40* (2006.01)
*H01L 29/423* (2006.01)
*H01L 29/10* (2006.01)

(52) U.S. Cl.
CPC .... *H01L 29/42368* (2013.01); *H01L 29/1095* (2013.01); *H01L 29/42376* (2013.01)

(58) Field of Classification Search
USPC ... 257/E29.257, E21.419, E29.26, 332, 923, 257/E21.629, E29.027, 163–166, 197, 257/205, 273
See application file for complete search history.

(56) References Cited

U.S. PATENT DOCUMENTS

| | | | |
|---|---|---|---|
| 9,324,848 B2 | 4/2016 | Sumitomo et al. | |
| 2009/0039419 A1* | 2/2009 | Zundel | H01L 29/0878 257/328 |
| 2010/0078707 A1* | 4/2010 | Haeberlen | H01L 29/7805 257/328 |
| 2012/0153386 A1* | 6/2012 | Hirler | H01L 29/0653 257/334 |
| 2012/0313164 A1* | 12/2012 | Senoo | H01L 29/1095 257/330 |
| 2013/0153995 A1 | 6/2013 | Misawa et al. | |
| 2014/0048847 A1* | 2/2014 | Yamashita | H01L 29/407 257/140 |
| 2014/0097863 A1* | 4/2014 | Zundel | H01L 22/34 324/762.01 |
| 2014/0320193 A1* | 10/2014 | Asahara | H01L 29/407 327/374 |
| 2015/0091053 A1* | 4/2015 | Sandow | H01L 29/7393 257/139 |
| 2015/0162407 A1* | 6/2015 | Laven | H01L 29/1095 257/139 |
| 2016/0190123 A1 | 6/2016 | Laven et al. | |

FOREIGN PATENT DOCUMENTS

| | | |
|---|---|---|
| JP | 2013-125827 A | 6/2013 |
| JP | 2013-251296 A | 12/2013 |
| JP | 2013-251395 A | 12/2013 |
| JP | 2016-154218 A | 8/2016 |

* cited by examiner

INSULATED GATE BIPOLAR TRANSISTOR

CROSS-REFERENCE TO RELATED APPLICATIONH

This application is based upon and claims the benefit of priority from the prior Japanese Patent Applications No. 2017-127476, filed on Jun. 29, 2017, and No. 2018-035431, filed on Feb. 28, 2018, the entire contents of which are incorporated herein by reference.

FIELD

Embodiments described herein relate generally to an insulated gate bipolar transistor.

BACKGROUND

An insulated gate bipolar transistor (hereinafter, referred to as IGBT) is generally used as a power semiconductor device having a breakdown voltage of not less than 600 V.

Since the power semiconductor device is generally used as a switch, it is desired that the power semiconductor device has a low ON resistance and a high switching speed. In order to reduce the ON resistance, a trench gate structure which extends further deeply into an $n^-$-type base layer from a channel region is used. The structure enables carriers to be effectively confined in the $n^-$-type base layer between the adjacent trench gates in order to cause conductivity modulation, and accordingly, the ON resistance of the IGBT is reduced.

However, due to the trench gate structure deeper than the channel, delay in the carrier storage at the period of transfer (turn-on) of the IGBT from the OFF state to the ON state is large, and delay in the carrier discharge at the period of transfer (turn-off) of the IGBT from the ON state to the OFF state is large. Accordingly, there is a problem that a switching loss at the period of turn-on and a switching loss at the period of turn-off are large.

DETAILED DESCRIPTION

Figure 1:
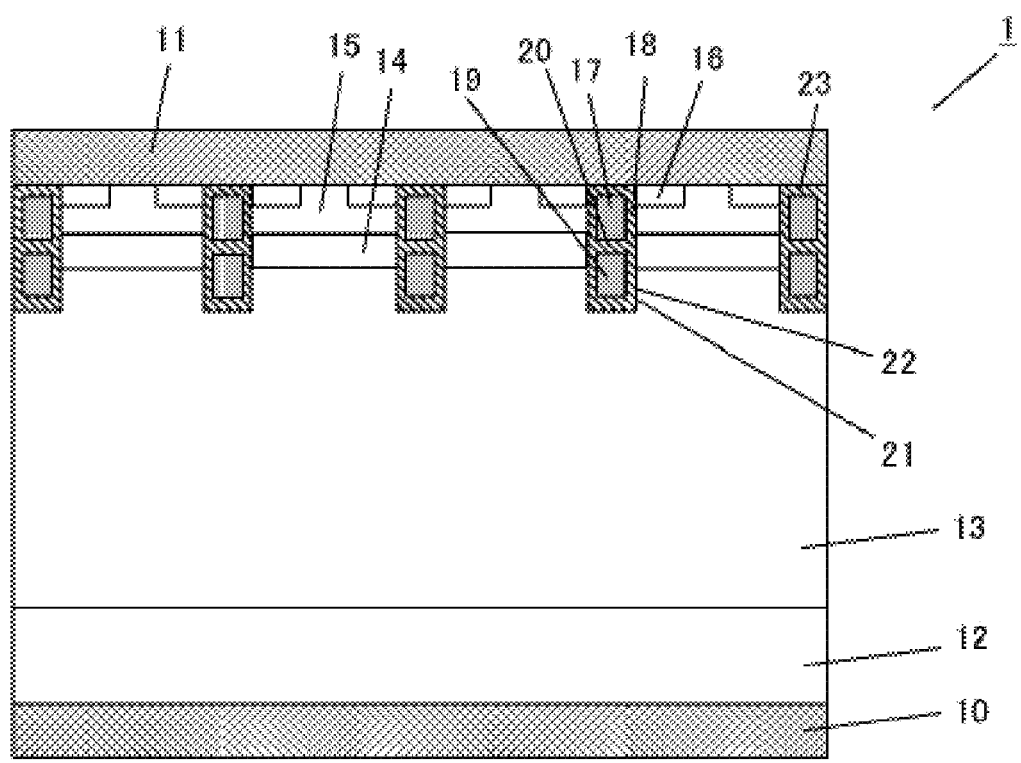
FIG. 1 is a sectional view of an IGBT according to a first embodiment.

According to one embodiment, an insulated gate bipolar transistor is provided with a first electrode, a second electrode, a first semiconductor layer, a second semiconductor layer, a third semiconductor layer, a fourth semiconductor layer, a fifth semiconductor layer, a third electrode, and a fourth electrode. The first semiconductor layer is provided between the first electrode and the second electrode and has a first conductivity type. The second semiconductor layer is provided between the second electrode and the first semiconductor layer and has a second conductivity type. The third semiconductor layer is provided between the second electrode and the second semiconductor layer, is of the second conductivity type, and has a higher impurity concentration than the second semiconductor layer. The fourth semiconductor layer is provided between the second electrode and the third semiconductor layer, is of the first conductivity type, and is electrically connected to the second electrode. The fifth semiconductor layer is selectively provided between the second electrode and the fourth semiconductor layer, is of the second conductivity type, is electrically connected to the second electrode, and has a higher impurity concentration than the second semiconductor layer. The third electrode is provided on the third semiconductor layer, the fourth semiconductor layer, and the fifth semiconductor layer via a gate insulating film, and is insulated from the first electrode and the second electrode. The fourth electrode is provided between the third electrode and the second semiconductor layer, and is insulated from the third electrode and the second semiconductor layer.

Hereinafter, embodiments of the invention will be described with reference to the drawings. The drawings used for description in the embodiments are schematic for easily performing the description, and a shape, a dimension, a size relation of each element in the drawings are not necessarily limited to those shown in the drawings when the embodiments are actually practiced, and those may be changed arbitrarily within the range in which the effect of the invention is obtained. The same reference numbers or the same reference symbols are used for the same elements having the same property, function, or feature, and the description will be omitted.

$n^+$, n, and $n^-$ indicate n-type semiconductors, and n-type impurity concentrations of the n-type semiconductors are set so as to becomes lower in the order. $p^+$, p, and $p^-$ indicate p-type semiconductors, and p-type impurity concentrations of the p-type semiconductors are set so as to become lower in the order. The n-type impurity concentration and the p-type impurity concentration do not indicate an actual concentration of n-type impurities and an actual concentration of p-type impurities, respectively, but indicate respective effective impurity concentrations after compensation. For example, when an actual concentration of p-type impurities is larger than an actual concentration of n-type impurities, an impurity concentration obtained by subtracting the actual concentration of the n-type impurities from the actual concentration of the p-type impurities is set to a p-type impurity concentration. This is applied to an n-type impurity concentration as well.

(First Embodiment)

An insulated gate bipolar transistor (hereinafter, referred to as an IGBT) in accordance with a first embodiment of the invention will be described with reference to FIG. 1. As shown in FIG. 1, an IGBT 1 in accordance with the embodiment is provided with a collector electrode 10 (a first electrode), an emitter electrode 11 (a second electrode), a $p^+$-type collector layer 12 (a first semiconductor layer), an $n^-$-type base layer 13 (a second semiconductor layer), an n-type barrier layer 14 (a third semiconductor layer), a p-type base layer 15 (a fourth semiconductor layer), an $n^+$-type emitter layer 16 (a fifth semiconductor layer), a gate electrode 17 (a third electrode), and a first field plate electrode 19 (a fourth electrode).

The $p^+$-type collector layer 12 is provided between the emitter electrode 11 and the collector electrode 10 and is a semiconductor layer having a first conductivity type. In the embodiment, the first conductivity type denotes a case of a p-type, and a second conductivity type denotes a case of an n-type. In addition, as the semiconductor layer, a silicon (Si) layer is shown as an example, but the semiconductor layer is not limited to the silicon layer. The $p^+$-type collector layer 12 has a p-type impurity total amount of about $1 \times 10^{13}$-$1 \times 10^{15}$ cm$^{-2}$, and has a layer thickness of about 0.1-10 μm. Each of the collector electrode 10 and the emitter electrode 11 is composed of a metal including at least one selected from the group of aluminum (Al), titanium (Ti), Nickel (Ni), tungsten (W), gold (Au), polysilicon, and so on, for example.

The $n^-$-type base layer 13 is provided between the emitter electrode 11 and the $p^+$-type collector layer 12 and is a semiconductor layer having the second conductivity type (hereinafter, the n-type). An n-type impurity concentration of the $n^-$-type base layer 13 is about $1 \times 10^{12}$-$1 \times 10^{15}$ (atoms/cm$^3$), and can be set to an arbitrary impurity concentration in accordance with high breakdown voltage design of the relevant device. In addition, a layer thickness of the $n^-$-type base layer 13 is about 1-1000 μm, and can be set to an arbitrary thickness in accordance with high breakdown voltage design of the relevant device.

The n-type barrier layer 14 is an n-type semiconductor layer, has a higher n-type impurity concentration than the n-type impurity concentration of the $n^-$-type base layer 13, and has an impurity total amount of about $1 \times 10^{12}$-$1 \times 10^{14}$ cm$^{-2}$. A layer thickness of the n-type barrier layer 14 is about 0.1-several μm.

The p-type base layer 15 is a p-type semiconductor layer, is provided between the emitter electrode 11 and the n-type barrier layer 14, and generally has a lower p-type impurity concentration than the p-type impurity concentration of the $p^+$-type collector layer 12. A p-type impurity total amount of the p-type base layer 15 is about $1 \times 10^{12}$-$1 \times 10^{14}$ cm$^{-2}$, and a layer thickness of the p-type base layer 15 is about 0.1-several μm. For the reason, there may be a case in which the p-type base layer 15 has a higher p-type impurity concentration than the p-type impurity concentration of the $p^+$-type collector layer 12, depending on the design. The p-type base layer 15 is electrically connected to the emitter electrode 11.

The $n^+$-type emitter layer 16 is an n-type semiconductor layer, is selectively provided between the emitter electrode 11 and the p-type base layer 15, and is electrically connected to the emitter electrode 11. The $n^+$-type emitter layer 16 has a higher n-type impurity concentration than the n-type impurity concentration of the $n^-$-type base layer 13, and has an n-type impurity total amount of about $1 \times 10^{14}$-$1 \times 10^{16}$ cm$^{-2}$. A layer thickness the $n^+$-type emitter layer 16 is about 0.1-several μm, and is smaller than the layer thickness of the p-type base layer 15.

A plurality of trenches 21 are provided periodically in an in-plane direction (a horizontal direction) of the p-type base layer 15. Each of the trenches 21 reaches the $n^-$-type base layer 13 from the emitter electrode 11 side through the $n^+$-type emitter layer 16, the p-type base layer 15, and the n-type barrier layer 14. A depth of the trench 21 is about 1-10 μm. A pitch between the adjacent trenches 21 is about 0.1-several μm. The $n^+$-type emitter layer 16, the p-type base layer 15, the n-type barrier layer 14 and the $n^-$-type base layer 13 are exposed to a side wall of the trench 21. A gate insulating film 18 covers on the $n^+$-type emitter layer 16, on the p-type base layer 15, and on the n-type barrier layer 14 at the side wall of the trench 21. The gate electrode 17 is provided on the $n^+$-type emitter layer 16, the p-type base layer 15, and the n-type barrier layer 14 via the gate insulating film 18. A first interlayer insulating film 23 exists between the gate electrode 17 and the emitter electrode 11, and the first interlayer insulating film 23 insulates the gate electrode 17 from the emitter electrode 11. The gate electrode 17 is electrically connected to a gate pad region in a region not shown. The gate pad region is electrically connected to a gate terminal (not shown).

A first insulating film 22 covers the n-type barrier layer 14, and the $n^-$-type base layer 13, at the side wall and the bottom portion of the trench 21, and continues to the gate insulating film 18. The first field plate electrode 19 is provided between the gate electrode 17 and the $n^-$-type base layer 13. An inter-electrode insulating film 20 exists between the gate electrode 17 and the first field plate electrode 19. The first insulating film 22 exists between the first field plate electrode 19 and the $n^-$-type base layer 13. In addition, the inter-electrode insulating film 20 continues to the gate insulating film 18 and the first insulating film 22. The first field plate electrode 19 is electrically connected to the emitter electrode in a region not shown, and has the same potential as the emitter electrode.

In other words, the gate electrode 17 (the third electrode) is provided on the $n^+$-type emitter layer 16, the p-type base layer 15, and the n-type barrier layer 14 via the gate insulating film 18, at the side wall of the trench 21. The gate electrode 17 is insulated from the emitter electrode 11 and the collector electrode 10. In addition, the first field plate electrode 19 is provided between the gate electrode 17 and the n⁻-type base layer 13, is insulated from the gate electrode 17 and the n⁻-type base layer 13, and is electrically connected to the emitter electrode 11.

In addition, the gate electrode 17 may be extended onto the n⁻-type base layer 13.

The gate insulating film 18, the first interlayer insulating film 23, the first insulating film 22, and the inter-electrode insulating film 20 which have been described above are made of silicon oxide (SiO₂), but are not limited to silicon oxide. In addition, the respective insulating films are not made of the same material, but may be made of different materials. The gate insulating film 18 is preferably thinner than the first insulting film 22, but is not limited to this. The gate electrode 17 and the first field plate electrode 19 are made of polysilicon containing n-type or p-type impurities, for example, but are not limited to the polysilicon.

A plurality of first trench gate structures, each composed of the gate electrode 17, the gate insulating film 18, the first insulating film 22, the first field plate electrode 19, the inter-electrode insulating film 20, and the first interlayer insulating film 23 in the trench 21, are repeatedly provided as unit cells in at least one direction within the horizontal plane of the p-type base layer 15. The first trench gate structures, for example, are repeatedly provided in the p-type base layer 15 at a pitch of about 0.1-several μm.

Figure 2:
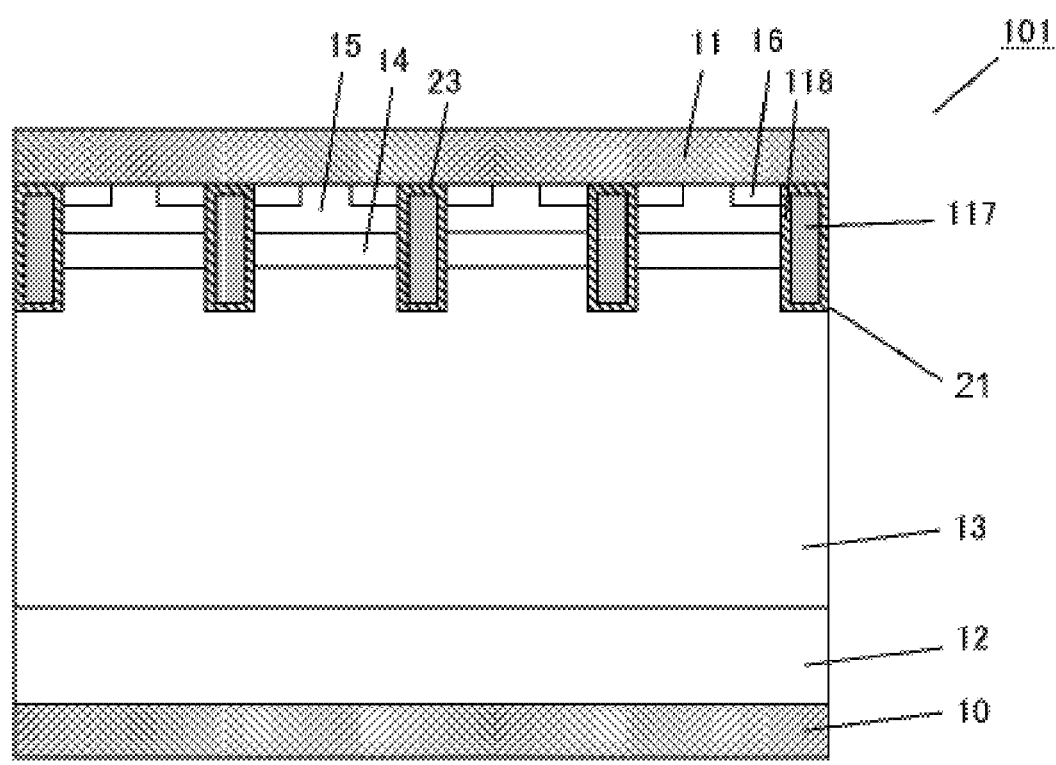
FIG. 2 is a sectional view of an IGBT according to a comparative example.

Before describing an operation of the IGBT 1 in accordance with the embodiment, a structure of an IGBT 101 of a comparative example will be described. FIG. 2 shows a sectional view of the IGBT 101 in accordance with the comparative example. The IGBT 101 in accordance with the comparative example and the IGBT 1 in accordance with the embodiment are different in the following points.

The IGBT 101 in accordance with the comparative example is provided with the emitter electrode 11, the collector electrode 10, the p⁺-type collector layer 12, the n⁻-type base layer 13, the n-type barrier layer 14, the p-type base layer 15, and the n⁺-type emitter layer 16, and the trenches 21 are provided in the IGBT 101, similarly as the IGBT 1 in accordance with the embodiment.

The IGBT 1 in accordance with the embodiment has a trench gate structure composed of the gate electrode 17, the gate insulating film 18, the first field plate electrode 19, the first insulating film 22, the inter-electrode insulating film 20, and the first interlayer insulating film 23 which are provided in the trench 21. In contrast, the IGBT 101 in accordance with the comparative example has a trench gate structure composed of a gate electrode 117, a gate insulating film 118, and the first interlayer insulating film 23 which are provided in the trench 21.

The gate insulating film 118 is provided so as to cover the n⁺-type emitter layer 16, the p-type base layer 15, the n-type barrier layer 14, and the n⁻-type base layer 13 which are exposed to the side wall of the trench 21, and the n⁻-type base layer 13 which is exposed to the bottom portion of the trench 21. The gate electrode 117 is provided in the trench 21 via only the gate insulating film 118. The gate electrode 117 is provided on the n⁺-type emitter layer 16, the p-type base layer 15, the n-type barrier layer 14, and the n⁻-type base layer 13 via the gate insulating film 118, at the side wall of the trench 21. The gate electrode 117 extends from on the n⁺-type emitter layer 16 to a part of the n⁻-type base layer 13 located at the bottom portion of the trench 21.

The IGBT 101 in accordance with the comparative example is different from the IGBT 1 in accordance with the embodiment in the trench gate structure as described above.

Figure 3:
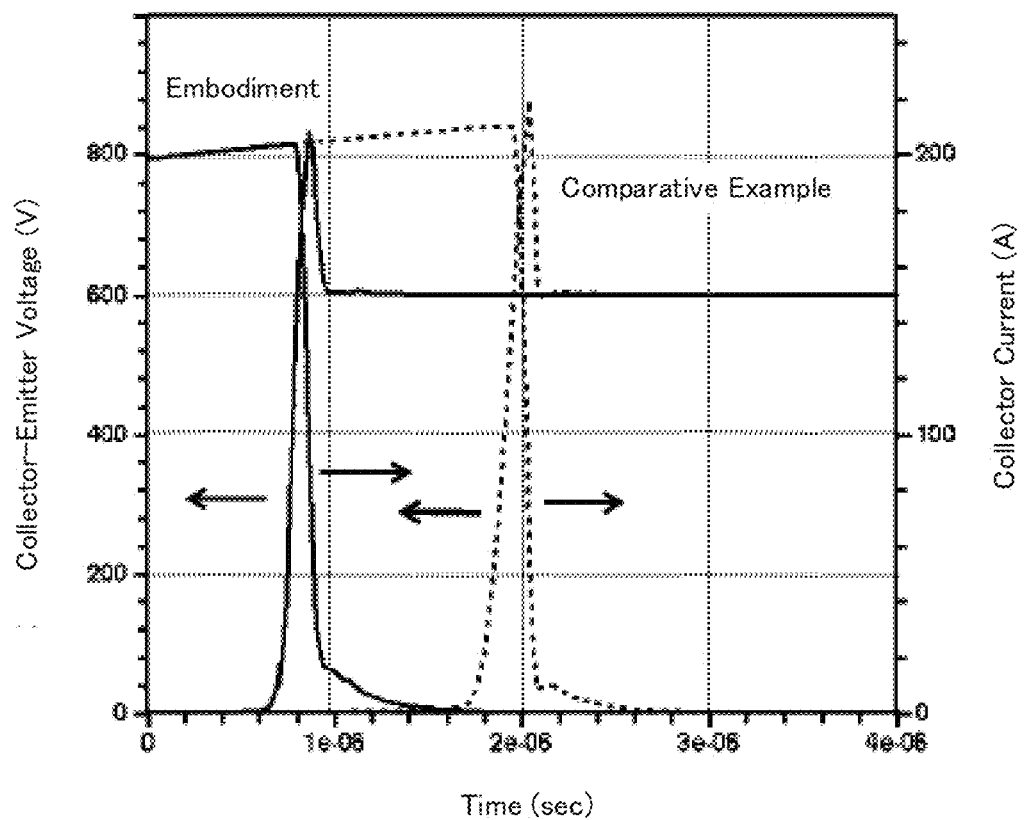
FIG. 3 is a diagram to compare turn-off characteristics of the IGBT according to the first embodiment and the IGBT according to the comparative example.

Switching characteristics of the IGBT 1 in accordance with the embodiment and switching characteristics of the IGBT 101 in accordance with the comparative example will be compared. FIG. 3 shows a simulation result of time change of a voltage between the collector electrode 10 and the emitter electrode 11 (hereinafter, referred to as a collector-emitter voltage) and a collector current at the period of turn-off of each of the IGBT 1 in accordance with the embodiment and the IGBT 101 in accordance with the comparative example. When a time is 0 second, a potential of the gate electrode is changed from a drive potential (15 V, for example) to 0 V, for example (start turn-off).

To begin with, an operation of the IGBT 101 in accordance with the comparative example will be described. When a definite time elapses after the start of turn-off, and a potential of the gate electrode becomes not more than a threshold voltage, a channel layer is vanished. A time in accordance with a sum of a gate-emitter capacitance Cge and a gate collector capacitance Cgc is required for the vanishment of the channel layer.

For the reason, a little time later after the start of turn-off, supply of electrons to the n⁻-type base layer 13 is cut off, and on the other hand, the electrons and the holes stored in the n⁻-type base layer 13 begin to be discharged to the collector and the emitter, respectively. As a result, a little time later after the start of turn-off, the collector current is decreased from the current during operation and becomes zero. A time required for the current to be decreased from the current value during operation to zero is determined by a time required for discharging the electrons and the holes in the n⁻-type base layer 13.

Figure 4:
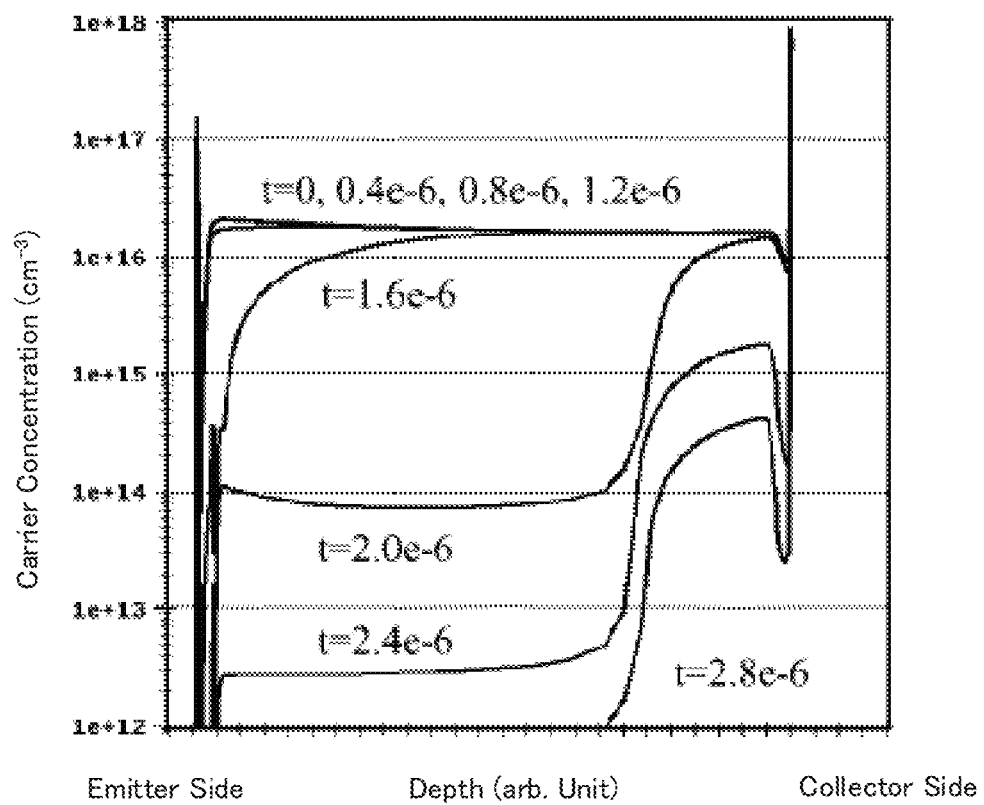
FIG. 4 is a diagram showing time transition of a carrier concentration distribution at the period of turn-off in the $n^-$-type base layer of the IGBT according to the comparative example.

FIG. 4 shows a simulation result of time change of an electron carrier concentration and a hole carrier concentration in the n⁻-type base layer 13 after the turn-off of the IGBT 101 in accordance with the comparative example. The electron carrier concentration is equal to the hole carrier concentration (hereinafter, when a carrier concentration is simply used, it means both of the electron carrier concentration and the hole carrier concentration). The carrier concentration shows values every $0.4 \times 10^{-6}$ seconds after the start of turn-off. In addition, "e" in the drawing indicates that a base of the power operation is 10.

As can be seen from FIG. 4, in the IGBT 101 in accordance with the comparative example, the carrier concentration is not changed until 1.2 microseconds, and the carrier concentration begins to decrease from the emitter side at 1.6 microseconds. The collector current begins to decrease corresponding to the decrease. At 2.8 microseconds, the carriers are depleted and the collector current becomes zero.

At the same time when the collector current decreases, a depletion layer extends from the boundary face of the p-type base layer 15 and the n-type barrier layer 14 toward the n⁻-type base layer 13, and the collector-emitter voltage increases from 0 V to the power source voltage. At the period of turn-off, the collector current decreases in a certain time period and the collector-emitter voltage increases in a certain time period, and thereby switching loss is generated. In the IGBT 101 in accordance with the comparative example, the switching loss at the period of turn-off was 21.1 mJ.

Figure 5:
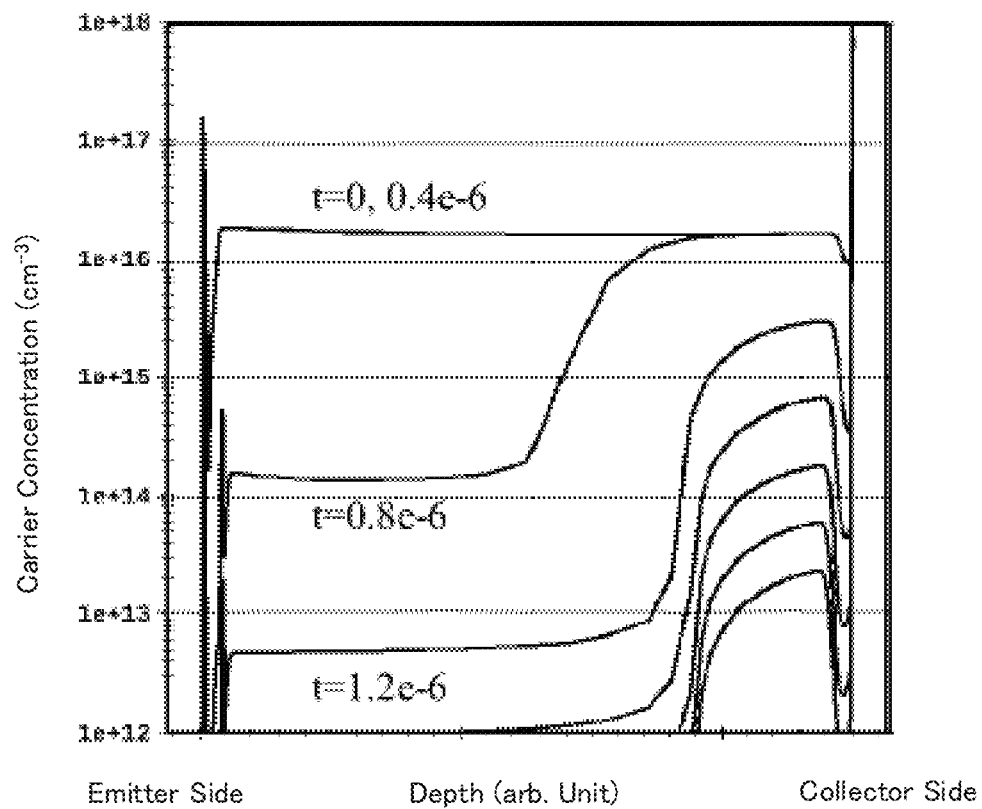
FIG. 5 is a diagram showing time transition of a carrier concentration distribution at the period of turn-off in the $n^-$-type base layer of the IGBT according to the first embodiment.

In contrast, in the IGBT 1 in accordance with the embodiment, a time until the beginning of increase of the collector-emitter voltage and a time until the beginning of decrease of the collector current after the start of turn-off are respectively shortened to about halves of those of the IGBT 101 in accordance with the comparative example, as shown in FIG. 3. FIG. 5 shows a simulation result of time change of an electron carrier concentration and a hole carrier concentration in the n⁻-type base layer 13 after the turn-off of the IGBT 1 in accordance with the embodiment. The carrier concentration begins to decreases between 0.4-0.8 microseconds after the start of turn-off. The carrier concentration is almost depleted at 1.6 microseconds. As a result, a time required for the collector current to begin to decrease is shortened to about a half of that of the IGBT 101.

The IGBT 101 in accordance with the comparative example has the gate electrode 117 provided in the trench 21 via the gate insulating film 118. The gate electrode 117 extends from on the n⁺-type emitter layer 16 to a part of the n⁻-type base layer 13 located at the bottom portion of the trench 21, at the side wall of the trench 21. Accordingly, the gate electrode 117 has the gate-emitter capacitance Cge which is formed by the p-type base layer 15, the gate insulating film 118, and the gate electrode 117. Further, the gate electrode 117 has the gate-collector capacitance Cgc (the feedback capacitance) which is formed by the n⁻-type base layer 13, the gate insulating film 118, and the gate electrode 117. The gate electrode 117 extends into the inside of the n⁻-type base layer 13, and thereby an n-type storage layer is formed in the n⁻-type base layer 13 to cause conductivity modulation. However, since the IGBT 101 is provided with the structure, the gate-collector capacitance Cgc has a large value.

In contrast, the IGBT 1 in accordance with the embodiment has the first field plate electrode 19 provided in the trench 21 via the first insulating film 22, and the gate electrode 17 provided in the trench 21 via the gate insulating film 18 and the inter-electrode insulating film 20. The first field plate electrode 19 is provided on the n⁻-type base layer 13 via the first insulating film 22. The gate electrode 17 is provided on the field plate electrode 19 via the inter-electrode insulating film 20, and on the p-type base layer 15 via the gate insulating film 18. The first field plate electrode 19 exists between the gate electrode 17 and the n⁻-type base layer 13, and thereby the gate electrode 17 hardly extends into the n⁻-type base layer 13, compared with the gate electrode 117 of the IGBT 101 in accordance with the comparative example.

Accordingly, the gate-collector capacitance Cgc of the IGBT 1 in accordance with the embodiment is much smaller than the gate-collector capacitance Cgc of the IGBT 101 in accordance with the comparative example. The larger the sum of the gate-emitter capacitance Cge and the gate-collector capacitance Cgc is, the more slowly the channel portion of the IGBT is vanished. The gate-collector capacitance Cgc of the IGBT 1 in accordance with the embodiment is negligibly small, as compared with the gate-collector capacitance Cgc of the IGBT 101 in accordance with the comparative example. Accordingly, the channel portion of the IGBT 1 in accordance with the embodiment vanishes faster than that of the IGBT 101 in accordance with the comparative example. Accordingly, in the IGBT 1 in accordance with the embodiment, a time required for the collector current to begin to decrease becomes shorter than that of the IGBT 101 in accordance with the comparative example, and thereby the results shown in FIG. 3 and FIG. 5 are obtained.

Since the collector-emitter voltage begins to increase in conjunction with the beginning of decrease of the collector current, a time required for the collector-emitter voltage to begin to increase is shorter in the IGBT 1 in accordance with the embodiment than in the IGBT 101 in accordance with the comparative example.

Further, at the period of turn-off, the collector current decreases in a certain time period, and the collector-emitter voltage increases in a certain time period, and thereby switching loss is generated. In the IGBT 1 in accordance with the embodiment, the switching loss at the period of turn-off was 18.2 mJ. The value is decreased by 13.7% as compared with the switching loss at the period of turn-off of the IGBT 101 in accordance with the comparative example. That the switching loss is small is thought to be that a time required for discharging the electrons and the holes stored in the n⁻-type base layer 13 is shorter in the IGBT 1 in accordance with the embodiment, as compared with the IGBT 101 in accordance with the comparative example.

In the IGBT 101 in accordance with the comparative example, the gate electrode 117 extends into the n⁻-type base layer 13. For the reason, the gate-collector capacitance Cgc is large, and a time required for discharging the gate-collector capacitance Cgc at the period of turn-off becomes long, and thereby a discharge time of the carriers becomes long.

In contrast, in the IGBT 1 in accordance with the embodiment, a two-stage structure of the gate electrode 17 and the first field plate electrode 19 is provided, in place of the gate electrode 117 in accordance with the comparative example, and the first field plate electrode 19 projecting into the n⁻-type base layer 13 is connected to the emitter electrode. For the reason, the gate-collector capacitance Cgc is small, and a time required for discharging the gate-collector capacitance Cgc at the period of turn-off becomes short, and thereby a discharge time of the carriers becomes short.

It is thought by the reason described above that the switching loss of the IGBT 1 in accordance with the embodiment at the period of turn-off has decreased as compared with the IGBT 101 in accordance with the comparative example.

Figure 6:
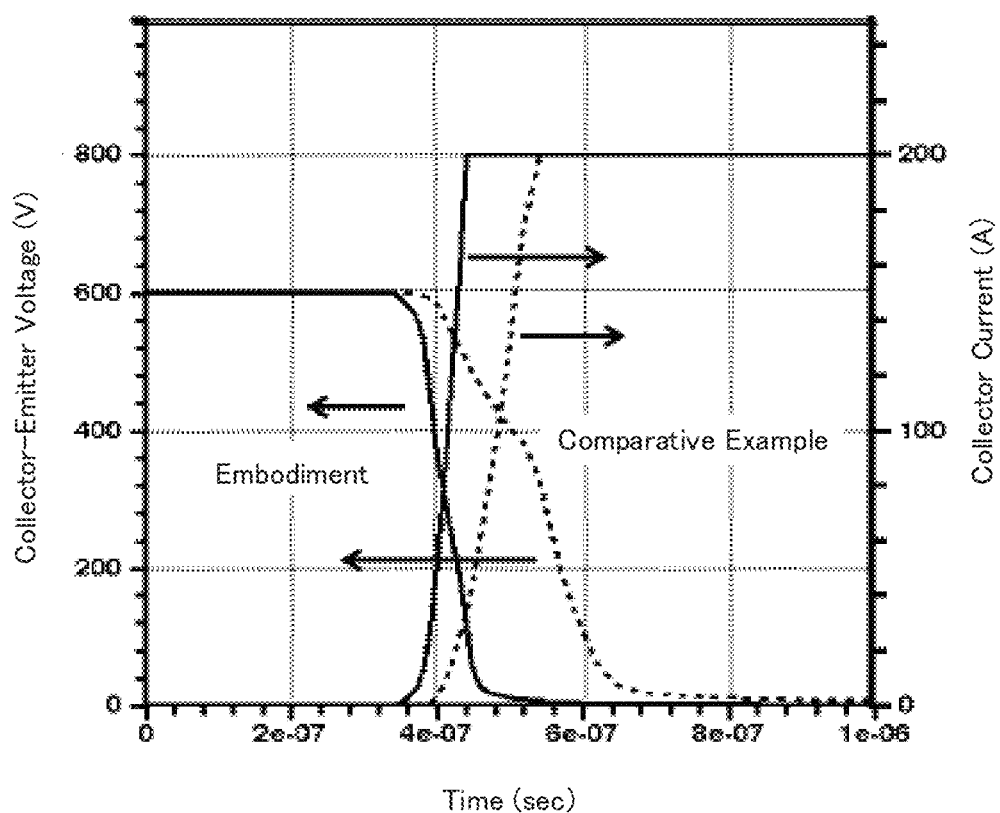
FIG. 6 is a diagram to compare turn-on characteristics of the IGBT according to the first embodiment of the invention and the IGBT according to the comparative example.
Figure 7:
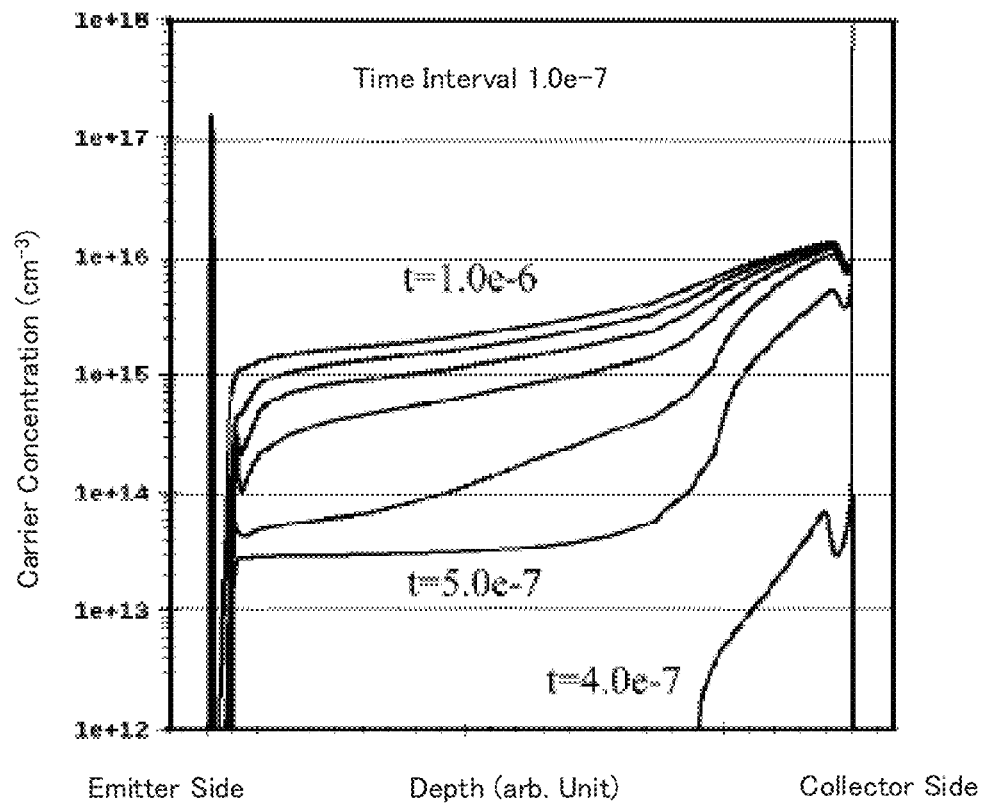
FIG. 7 is a diagram showing time transition of a carrier concentration distribution at the period of turn-on in the $n^-$-type base layer of the IGBT according to the comparative example.
Figure 8:
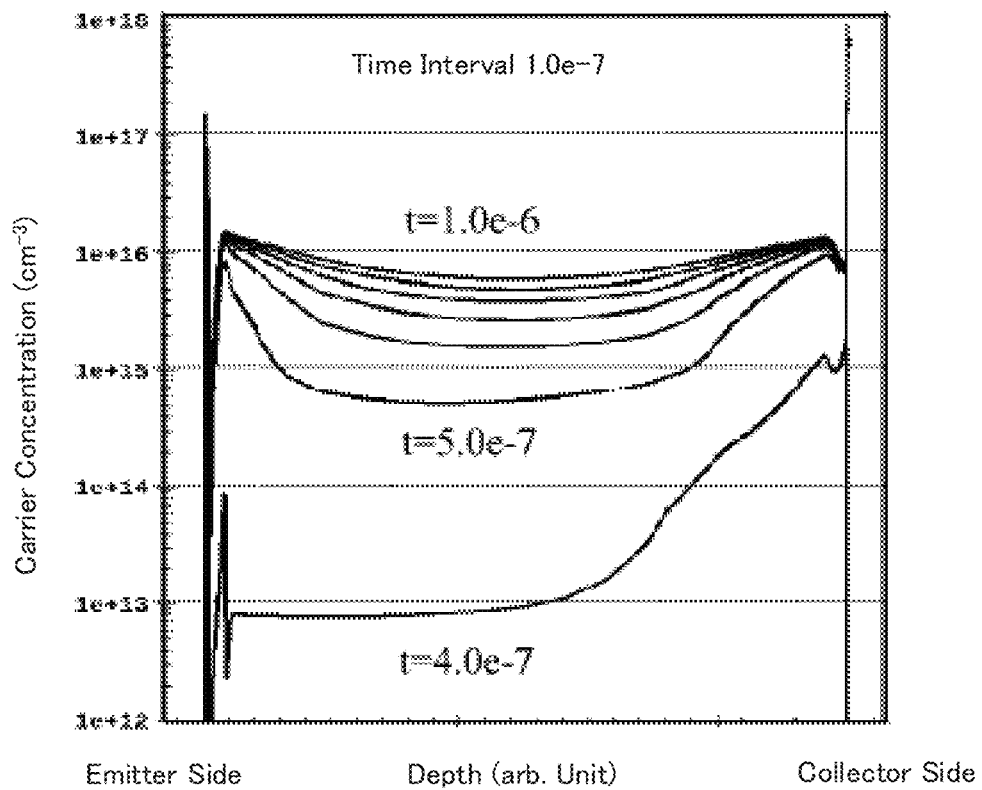
FIG. 8 is a diagram showing time transition of a carrier concentration distribution at the period of turn-on in the $n^-$-type base layer of the IGBT according to the first embodiment.

Next, characteristics at the period of turn-on of the IGBT 1 in accordance with the embodiment and characteristics at the period of turn-on of the IGBT 101 in accordance with the comparative example will be compared. FIG. 6 shows time change of a collector current and a collector-emitter voltage at the period of turn-on of each of the IGBT 1 in accordance with the embodiment and the IGBT 101 in accordance with the comparative example. FIG. 7 shows time change of a carrier concentration in the n⁻-type base layer 13 at the period of turn-on of the IGBT 101 in accordance with the comparative example. FIG. 8 shows time change of a carrier concentration in the n⁻-type base layer 13 at the period of turn-on of the IGBT 1 in accordance with the embodiment. In any of the drawings, a time when the potential of the gate electrode is changed from 0 V to the drive potential during operation is set to 0 second, (start turn-on). FIG. 7 and FIG. 8 each shows a profile of a carrier concentration when a time is switched in the unit of 0.1 microseconds. The horizontal axis indicates a depth in the n⁻-type base layer 13, and the left side is the emitter side and the right side is the collector side.

To begin with, an operation of the IGBT 101 in accordance with the comparative example will be described. When the potential of the gate electrode becomes not less than the threshold voltage after the start of turn-on, the channel layer is formed. A time in accordance with the sum of the gate-emitter capacitance Cge and the gate collector capacitance Cgc is required for the formation of the channel layer.

For the reason, a little time later after turn-on, electrons are supplied from the emitter to the n⁻-type base layer 13 via the channel layer, and thereby holes begin to be supplied from the p-type collector layer 12 into the n⁻-type base layer 13. As a result, a little time later after turn-on, the collector current increases from 0 A, and becomes a current during operation (200 A in this case). A time required for the collector current to reach from 0 A to the current value during operation is determined by a time required for charging the electrons and the holes in the n⁻-type base layer 13. FIG. 7 shows a simulation result of time change of an electron carrier concentration and a hole carrier concentration in the n⁻-type base layer 13, after the turn-on of the IGBT 101 in accordance with the comparative example. The electron carrier concentration is equal to the hole carrier concentration. The carrier concentration shows values every $0.1 \times 10^{-6}$ seconds (0.1 microseconds) after turn-on.

As can be seen from FIG. 7, in the IGBT 101 in accordance with the comparative example, the carrier concentration is not changed until 0.4 microseconds, and the carrier concentration begins to increase from the collector side at 0.5 microseconds. The collector current begins to increase corresponding to the increase. At about 0.55 microseconds, the collector current approximately reaches the operation current.

At the same time when the collector current increases, the depletion layer extending from the boundary face of the p-type base layer 15 and the n-type barrier layer 14 toward the n⁻-type base layer 13 is reduced, and the collector-emitter voltage decreases from the power source voltage (600 V) to 0 V. At the period of turn-on, the collector current increases in a certain time period and the collector-emitter voltage decreases in a certain time period, and thereby switching loss is generated. In the IGBT 101 in accordance with the comparative example, the switching loss at the period of turn-on was 10.0 mJ.

In contrast, in the IGBT 1 in accordance with the embodiment, a time until the beginning of decrease of the collector-emitter voltage and a time until the beginning of increase of the collector current after turn-on are respectively shortened as compared with those of the IGBT 101 in accordance with the comparative example, as shown in FIG. 6. FIG. 8 shows a simulation result of time change of an electron carrier concentration and a hole carrier concentration in the n⁻-type base layer 13 after the turn-on of the IGBT 1 in accordance with the embodiment. The carrier concentration begins to increase at a time until 0.4 microseconds after turn-off. The carrier concentration is almost saturated at 0.6 microseconds. As a result, in the IGBT 1 in accordance with the embodiment, a time required for the collector current to begin to increase is shortened, as described above.

As described above, the gate-collector capacitance Cgc of the IGBT 1 in accordance with the embodiment is much smaller than the gate-collector capacitance Cgc of the IGBT 101 in accordance with the comparative example. The larger the sum of the gate-emitter capacitance Cge and the gate-collector capacitance Cgc is, the more slowly the channel portion of the IGBT is formed. The gate-collector capacitance Cgc of the IGBT 1 in accordance with the embodiment is negligibly small, as compared with the gate-collector capacitance Cgc of the IGBT 101 in accordance with the comparative example. Accordingly the channel portion of the IGBT 1 in accordance with the embodiment is formed faster than that of the IGBT 101 in accordance with the comparative example. Accordingly, in the IGBT 1 in accordance with the embodiment, a time required for the collector current to begin to increase becomes shorter than that of the IGBT 101 in accordance with the comparative example, and thereby the results shown in FIG. 6 and FIG. 8 are obtained.

Since the collector-emitter voltage begins to decrease in conjunction with the beginning of increase of the collector current, a time required for the collector-emitter voltage to begin to decrease is shorter in the IGBT 1 in accordance with the embodiment than in the IGBT 101 in accordance with the comparative example.

Further, at the period of turn-on, the collector current increases in a certain time period, and the collector-emitter voltage decreases in a certain time period, and thereby switching loss is generated. In the IGBT 1 in accordance with the embodiment, the switching loss at the period of turn-on was 3.2 mJ. The value is decreased by 68% as compared with the switching loss at the period of turn-on of the IGBT 101 in accordance with the comparative example. That the switching loss is small is thought to be that a speed at which the electrons and the holes are stored in the n⁻-type base layer 13 in the IGBT 1 in accordance with the embodiment is faster as compared with the IGBT 101 in accordance with the comparative example.

In the IGBT 101 in accordance with the comparative example, the gate electrode 117 extends into the n⁻-type base layer 13. For the reason, the gate-collector capacitance Cgc is large, and thereby a voltage fall time at the period of turn-on becomes long.

In contrast, in the IGBT 1 in accordance with the embodiment, the two-stage structure of the gate electrode 17 and the first field plate electrode 19 is provided, in place of the gate electrode 117 in accordance with the comparative, and the first field plate electrode 19 projecting into the n⁻-type base layer 13 is connected to the emitter electrode. For the reason, the gate-collector capacitance Cgc is small, and thereby a voltage fall time at the period of turn-on becomes short.

As a result, regarding a time required for the collector current to begin to increase and the voltage fall time, the IGBT 1 in accordance with the embodiment is accelerated, and it is thought that as compared with the IGBT 101 in accordance with the comparative example, in the IGBT 1 in accordance with the embodiment, the switching loss at the period of turn-on is decreased to a large extent compared with the switching loss at the period of turn-off.

(Modification Of First Embodiment)

An IGBT 1a in accordance with a modification of the first embodiment of the invention will be described with reference to FIG. 9. In the IGBT 1 in accordance with the first embodiment, the gate electrode 17 and the first field plate electrode 19 are laminated from the emitter electrode 11 toward the direction of the collector electrode 10 in the trench 21. In the modification, when a length of the gate electrode 17 in the direction of the collector electrode 10 is tg1, and a length of the first field plate electrode 19 in the direction of the collector electrode 10 is tg2, tg1 is made larger than tg2. Accordingly, the gate electrode 17 extends into the n⁻-type base layer 13, and the n-type storage layer is formed in the n⁻-type base layer 13 to cause conductivity modulation, and thereby the ON voltage can be reduced. Conversely, when tg1 is made short, the ON voltage is increased. In contrast, even when the length tg2 of the first field plate electrode 19 is made short, a reduction effect of the gate-collector capacitance Cgc is sufficiently attained, and the switching loss can be effectively reduced. From the above-described reason, the structure in which tg1>tg2 becomes a better structure.

(Second Embodiment)

An IGBT 2 in accordance with a second embodiment of the invention will be described with reference to FIG. 10. The IGBT 2 in accordance with the embodiment is different from the IGBT 1 in accordance with the first embodiment in a point that the IGBT 2 is provided with a second field plate electrode 26 (a fifth electrode), which is provided on the n⁻-type base layer 13, the n-type barrier layer 14, and the p-type base layer 15 via a second insulating film 25, and opposite to the gate electrode 17 and the first field plate electrode 19, and is electrically connected to the emitter electrode 11. That is, the second field plate electrode 26 is embedded in a trench 24 which extends from the surface of the p-type base layer 15, through the n-type barrier layer 14 into the n$^-$-type base layer 13, via the second insulating film 25.

A depth of the trench 24 is approximately the same as a depth of the trench 21. The second field plate electrode 26 is composed of polysilicon similarly as the first field plate electrode 19. A distance between an end of the first field plate electrode 19 at the collector electrode 10 side and the emitter electrode 11 is approximately the same as a distance between an end of the second field plate electrode 26 at the collector electrode 10 side and the emitter electrode 11. The second insulating film 25 is composed of silicon oxide, for example, similarly as the first insulating film 22. A thickness of the second insulating film 25 is approximately the same as a thickness of the first insulating film 22.

In the IGBT 1 in accordance with the first embodiment, a plurality of first trench gate structures, each composed of the gate electrode 17, and the first field plate electrode 19 which are provided in the trench 21, are repeatedly provided in at least one direction within the plane of the p-type base layer 15. In contrast, in the IGBT 2 in accordance with the embodiment, one of the adjacent first trench gate structures in the IGBT 1 in accordance with the first embodiment is replaced by a second trench gate structure composed of the second field plate electrode 26 embedded in the trench 24 via the second insulating film 25, to make a unit by the first trench gate structure and the second trench gate structure, and a plurality of the units are repeatedly provided. In addition, the n$^+$-type emitter layer 16 is not adjacent to the second field plate electrode 26 via the second insulating film 25.

The IGBT 2 in accordance with the embodiment has the structure in which the first trench gate structures are periodically replaced by the second trench gate structures as described above. For the reason, the IGBT 2 in accordance with the embodiment has a smaller gate-emitter capacitance as compared with the IGBT 1 in accordance with the first embodiment. As a result, in the IGBT 2 in accordance with the embodiment, a time required for the collector current to begin to decrease after turn-off and a time required for the collector current to begin to increase after turn-on become further shorter than those of the IGBT 1 in accordance with the first embodiment. Accordingly, the IGBT 2 in accordance with the embodiment has better switching characteristics as compared with the IGBT 1 in accordance with the first embodiment.

(Third Embodiment)

Figure 11:
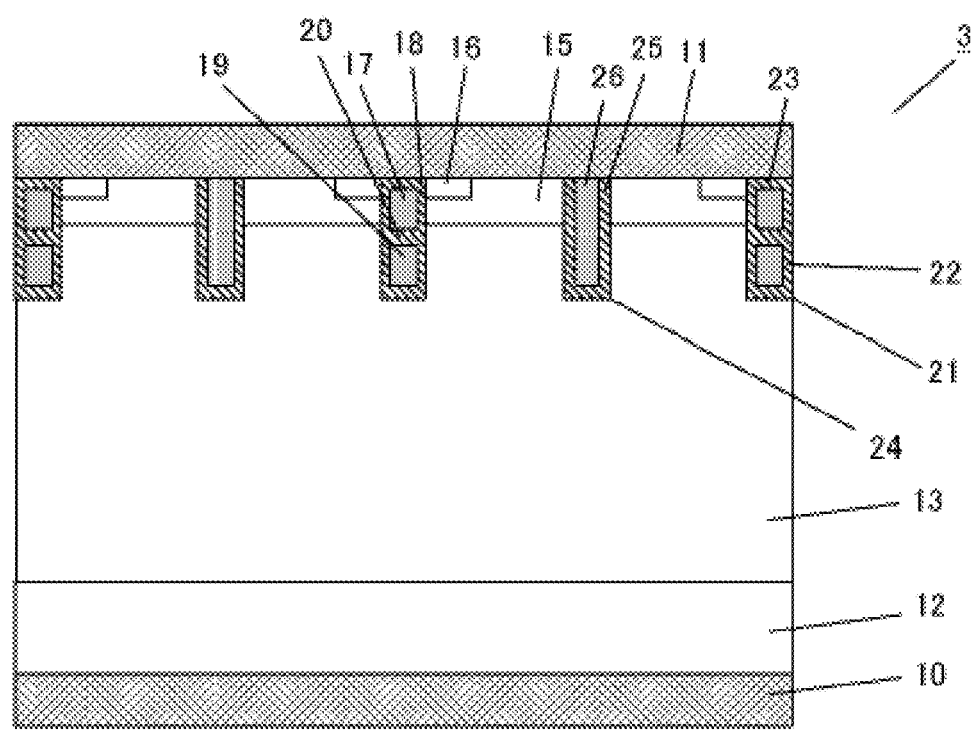
FIG. 11 is a sectional view of an IGBT according to a third embodiment.

An IGBT 3 in accordance with a third embodiment of the invention will be described with reference to FIG. 11. A point different from the second embodiment will be mainly described. FIG. 11 is a sectional view of the IGBT 3 in accordance with the embodiment. The IGBT 3 in accordance with the embodiment is different from the IGBT 2 in accordance with the second embodiment in a point that the n-type barrier layer 14 does not exist in the IGBT 2 in accordance with the second embodiment.

Since the n-type barrier layer 14 does not exist in the IGBT 3 in accordance with the embodiment, the IGBT 3 has a little disadvantage regarding the conductivity modulation, but a time required for discharging the carriers at the period of turn-off becomes shorter, and accordingly the IGBT 3 is superior to the IGBT 2 in accordance with the second embodiment in the switching characteristics.

(Fourth Embodiment)

Figure 12:
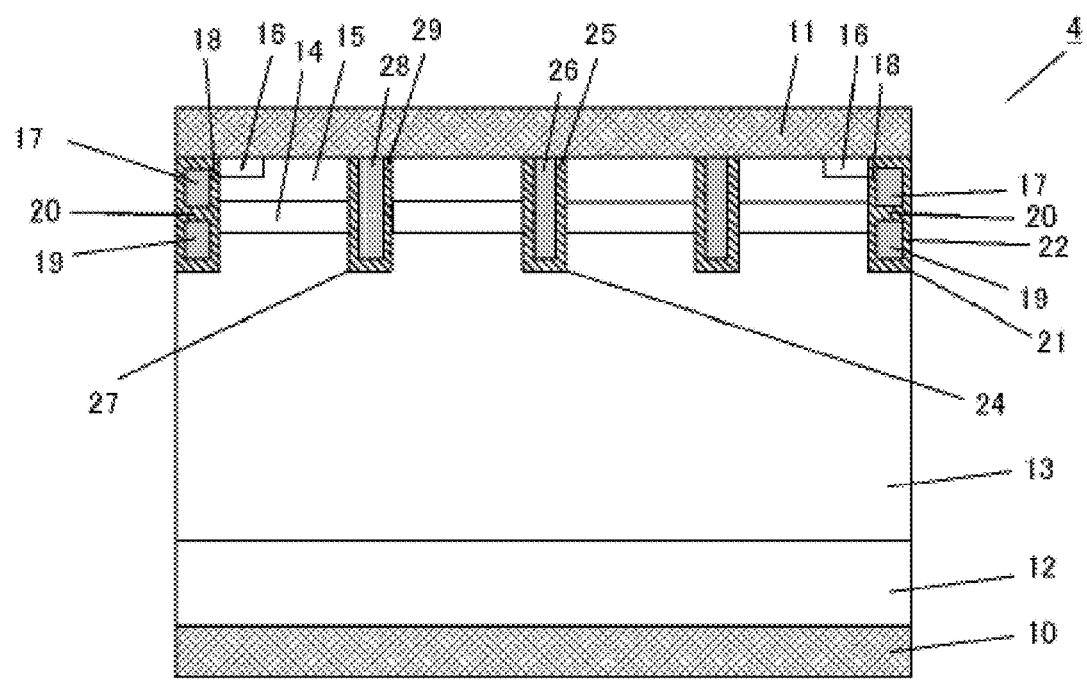
FIG. 12 is a sectional view of an IGBT according to a fourth embodiment.

An IGBT 4 in accordance with a fourth embodiment of the invention will be described with reference to FIG. 12. A point different from the second embodiment will be mainly described. FIG. 12 is a sectional view of the IGBT 4 in accordance with the embodiment. The IGBT 4 in accordance with the embodiment is different from the IGBT 2 in accordance with the second embodiment, in a point that in the IGBT 2 in accordance with the second embodiment, the first trench gate structure is replaced by the second trench gate structure, and a structure composed of the one first trench gate structure and the three second trench gate structures is made a unit, and the units are periodically and repeatedly provided for a plurality of times.

In other words, the IGBT 4 in accordance with the embodiment has a third field plate electrode 28 between the gate electrode 17 and the second field plate electrode 26. The third field plate electrode 28 is embedded in a trench 27 which extends from the surface of the p-type base layer 15, through the n-type barrier layer 14 into the n$^-$-type base layer 13 via a third insulating film 29.

The third field plate electrode 28 is composed of polysilicon similarly as the second field plate electrode 26. A length of the third field plate electrode 28 extending from the p-type base layer 15 to the n$^-$-type base layer 13 is the same as the length of the second field plate electrode 26. The third insulating film 29 is composed of silicon oxide similarly as the second insulating film 25.

Also the IGBT 4 in accordance with the embodiment has good switching characteristics similarly as the IGBT 2 in accordance with the second embodiment.

In addition, as an expansion of the embodiment, it is apparent that when a structure in which an arbitrary number (not three) of the second trench gate structures are provided next to the one first trench gate structure is made the unit, the similar effect is obtained.

(Fifth Embodiment)

Figure 13:
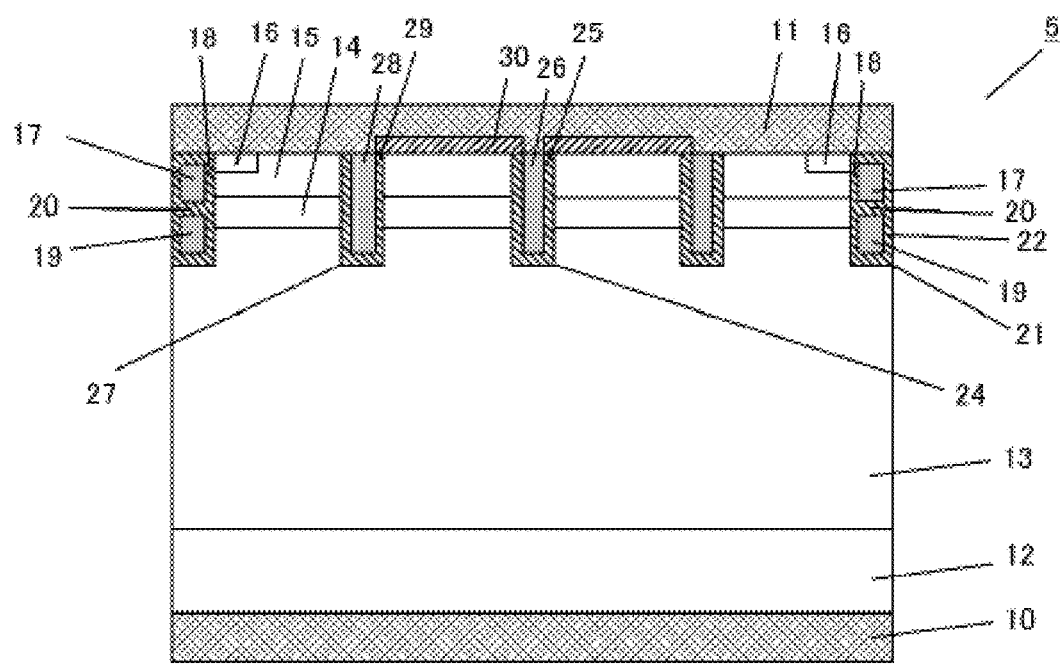
FIG. 13 is a sectional view of an IGBT according to a fifth embodiment.

An IGBT 5 in accordance with a fifth embodiment of the invention will be described with reference to FIG. 13. A point different from the IGBT 4 in accordance with the fourth embodiment will be mainly described. FIG. 13 is a sectional view of the IGBT 5 in accordance with the embodiment. The IGBT 5 in accordance with the embodiment is different from the IGBT 4 in accordance with the fourth embodiment, in a point that the IGBT 5 has second interlayer insulating films 30 each of which covers the p-type base layer 15 between the adjacent second trench gate structures in the IGBT 4 in accordance with the fourth embodiment.

That is, the second interlayer insulating film 30 is provided between the emitter electrode 11 and the p-type base layer 15, and covers the p-type base layer 15. The second interlayer insulating film 30 continues to the second insulating film 25 and the third insulating film 29, and straddles on the p-type base layer 15. The second interlayer insulating film 30 is composed of silicon oxide, for example.

Figure 14:
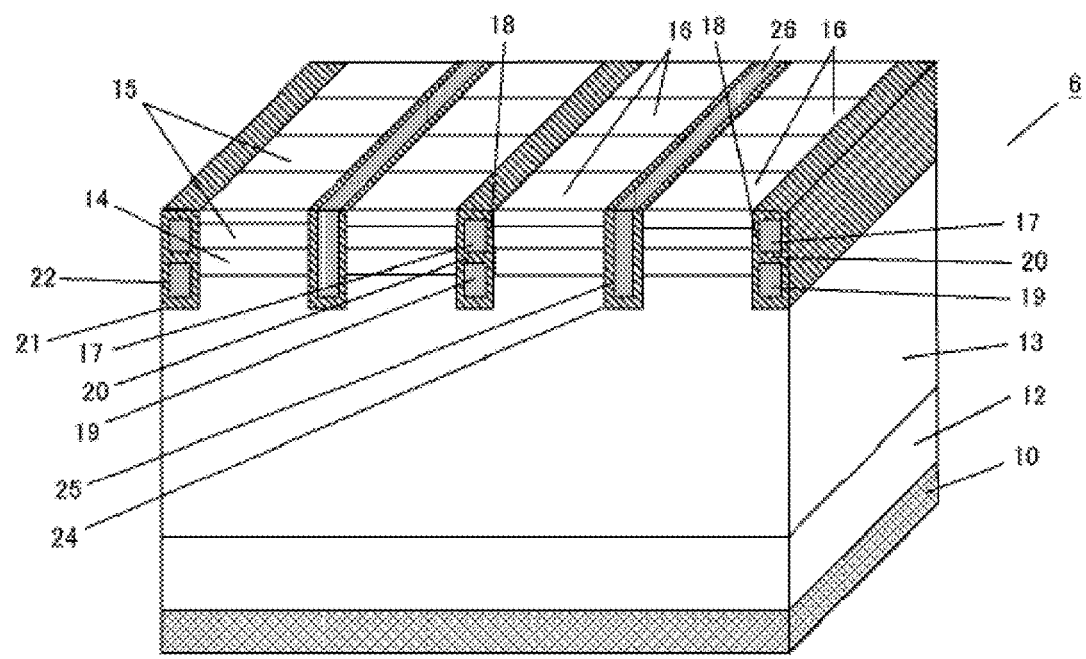
FIG. 14 is a perspective sectional view of an IGBT according to a sixth embodiment.

In the IGBT 5 in accordance with the embodiment, since the holes in the n$^-$-type base layer 13 are suppressed from escaping into the emitter electrode 11 by the second interlayer insulating film 30, the hole carrier concentration and the electron carrier concentration in the n$^-$-type base layer 13 are increased to promote the conductivity modulation. The IGBT 5 in accordance with the embodiment is excellent in switching responsiveness, and has the small switching loss and the low ON resistance, similarly as the IGBTs in accordance with the other embodiments Sixth Embodiment An IGBT 6 in accordance with a sixth embodiment of the invention will be described with reference to FIG. 14. A point different from the IGBT 2 in accordance with the second embodiment will be mainly described. FIG. 14 is a perspective sectional view of the IGBT 6 in accordance with the embodiment. In the IGBT 6 in accordance with the embodiment, a plurality of the n+-type emitter layers 16 are periodically and separately provided in the p-type base layer 15 along a direction vertical to a direction in which the gate electrodes 17 and the second field plate electrodes 26 are alternately arranged, in the IGBT 2 in accordance with the second embodiment. Each of the plurality of the n+-type emitter layers 16 connects to the gate electrode 17 via the gate insulating film 18, and connects to the second field plate electrode 26 via the second insulating film 25. The IGBT 6 in accordance with the embodiment is different from the IGBT 2 in accordance with the second embodiment, in the above-described point.

The IGBT 6 in accordance with the embodiment is excellent in switching responsiveness, and has the small switching loss and the low ON resistance, similarly as the IGBT 2 in accordance with the second embodiment. Further, the IGBT 6 in accordance with the embodiment has good contact between the n+-type emitter layer 16 and the p-type base layer 15, and the emitter electrode 11, when the distance between the gate electrode 17 and the second field plate electrode 26 is made short by promoting the miniaturization.

(Seventh Embodiment)

Figure 15:
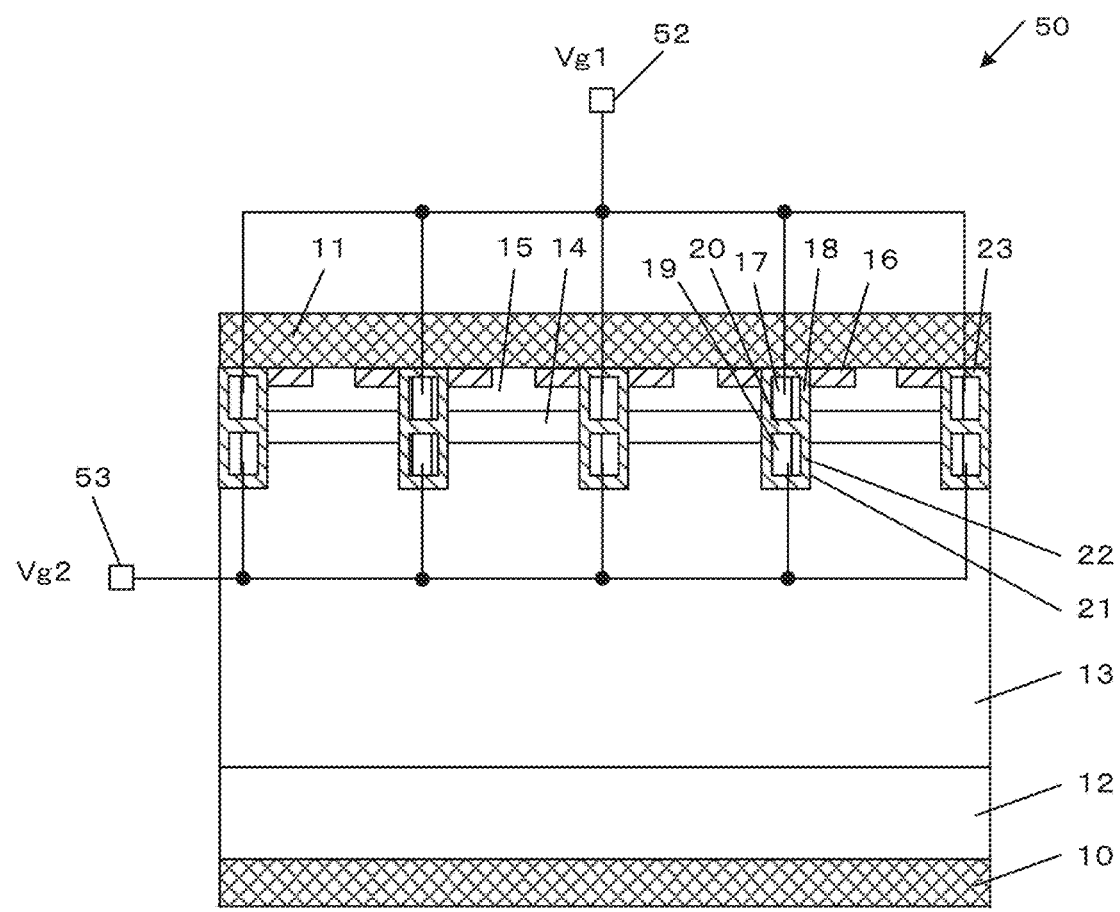
FIG. 15 is a sectional view of an IGBT according to a seventh embodiment.

An IGBT in accordance with a seventh embodiment of the invention will be described with reference to FIG. 15 to FIG. 19. FIG. 15 is a sectional view showing the IGBT in accordance with the embodiment. The description of the same portions in the embodiment as the first embodiment will be omitted, and different points will be described. A point in which the embodiment is different from the first embodiment is that the fourth electrode is configured so that a potential of the fourth electrode can be changed similarly as the gate electrode. The other points are the same as the first embodiment.

That is, as shown in FIG. 15, in an IGBT 50 of the embodiment, each of the gate electrodes 17 (hereinafter, referred to as first gate electrodes 17) is led out on the p-type base layer 15 in a region not shown, and is electrically connected to a first gate pad 52 via a first gate wiring not shown. Similarly, each of the fourth electrodes 19 (Hereinafter, the fourth electrodes 19 are conveniently referred to as second gate electrodes 19. However, here, the second gate electrode is used as the meaning of an electrode to which a voltage is applied as described above, and it is not necessarily required for the second gate electrode to have a gate function.) is led out on the p-type base layer 15 in a region not shown, and is electrically connected to a second gate pad 53 via a second gate wiring not shown. The first gate electrodes 17 and the second gate electrodes 19 are electrically separated from each other, and are configured to be given with control voltages independently.

Figure 16:
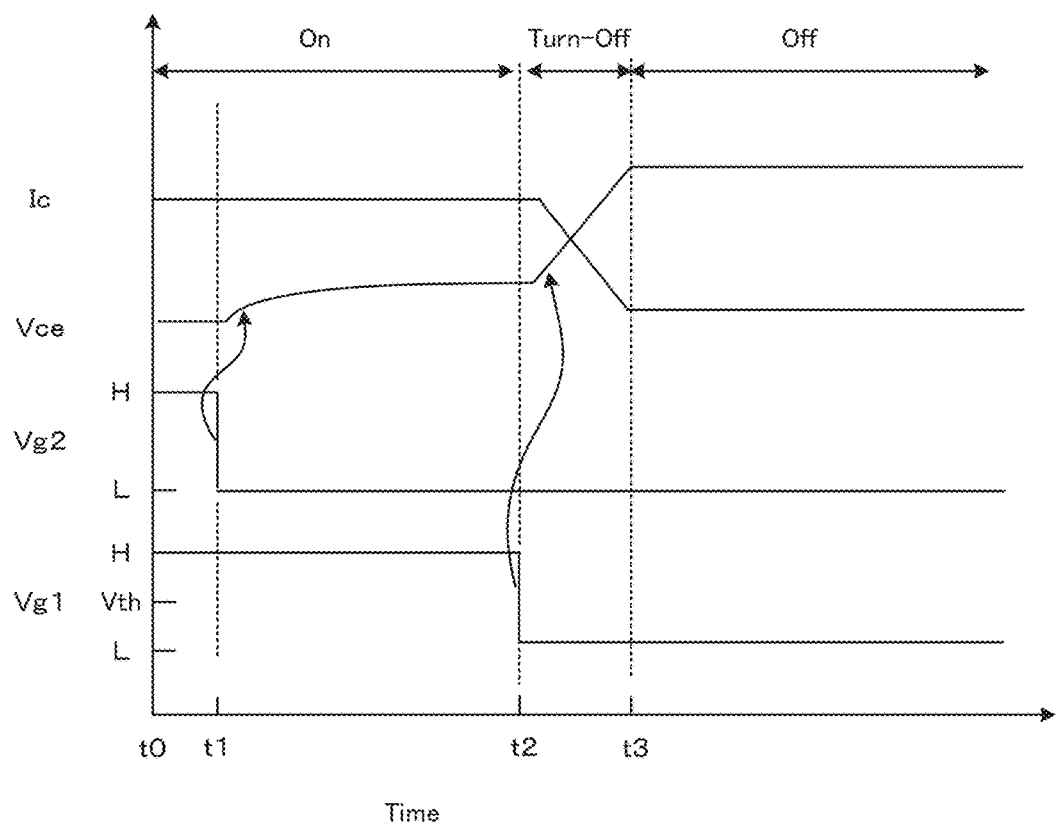
FIG. 16 is a timing chart showing a control method at the period of turn-off of the IGBT according to the seventh embodiment.

FIG. 16 is a timing chart showing a control method at the period of turn-off of the IGBT 50 of the embodiment. In FIG. 16, the horizontal axis indicates a time, and the vertical axis schematically indicates a first gate voltage Vg1 given to the first gate electrode 17, a second gate voltage Vg2 given to the second gate electrode 19, a collector-emitter voltage Vce, and a collector current Ic.

It is shown that the IGBT 50 is in the ON state (steady state) between a time t0 and a time t1, and in a term between the time t1 and a time t2, the IGBT 50 is in the ON state, but the term is a term for adjusting the carrier concentration of the n−-type base layer 13. It is shown that between the time t2 and a time t3, the IGBT 50 is in the turn-off term in which the IGBT 50 transfers from the ON state to the OFF state, and at the time t3 or later, the IGBT 50 is in the OFF state.

As shown in FIG. 16, positive voltages (High) are respectively given to the first gate electrode 17 and the second gate electrode 19 in the ON state. The first gate voltage Vg1 is a voltage not less than a threshold voltage Vth. The second gate voltage Vg2 has only to be a positive voltage, and is not particularly limited, but is preferably the same voltage as the first gate electrode Vg1.

When the first gate voltage Vg1 is given to the first gate electrode 17, an n-type channel layer (an inversion layer) is formed in the p-type base layer 15 in the vicinity of the gate insulating film 18 provided on the side wall of the first gate electrode 17. When the second gate voltage Vg2 is given to the second gate electrode 19, an n-type carrier storage layer is formed in the n−-type base layer 13 in the vicinity of the first insulating film 22 provided on the side wall of the second gate electrode 19.

Accordingly, electrons flow from the n+-type emitter layer 16 into the n−-type base layer 13 via the n-type channel layer, the n-type barrier layer 14 and the n-type storage layer, and holes flow from the p+-type collector layer 12 into the n−-type base layer 13, and the resistance value of the n−-type base layer 13 is reduced due to the conductivity modulation, and thereby the IGBT 50 becomes in the ON state (conduction state).

At this time, the storage of the carriers (electrons) at the emitter side is promoted, and also the storage of the holes in the n−-type base layer 13 is promoted, by the formation of the n-type storage layer, and thereby reduction of the ON resistance can be achieved. The reason that the storage of the holes in the n−-type base layer 13 is promoted is because the holes which have flowed into the n−-type base layer 13 pass through a region between the adjacent trenches 21 and escape into the p-type base layer 15, but a route through which the holes flow into the p-type base layer 15 is narrowed since the route is sandwiched between the adjacent n-type storage layers. Since the n-type storage layer can be controlled in accordance with the second gate voltage Vg2 given to the second gate electrode 19, the lower ON resistance is obtained.

In addition, since the carrier concentration at the emitter side is in a high state due to the n-type barrier layer 14, the holes become harder to escape from the n−-type base layer 13 into the p-type base layer 15. The storage of the holes in the n−-type base layer 13 is promoted, and accordingly, the further lower ON resistance can be obtained.

Figure 17A:
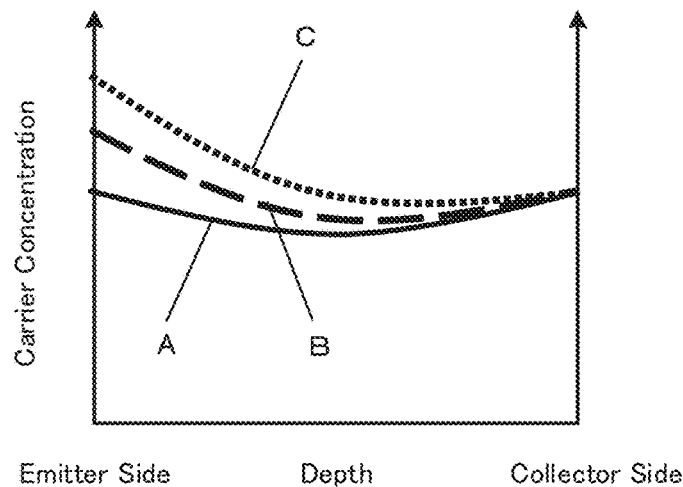
FIGS. 17A and 17B are each a diagram of a carrier concentration distribution of the IGBT according to the seventh embodiment.
Figure 17B:
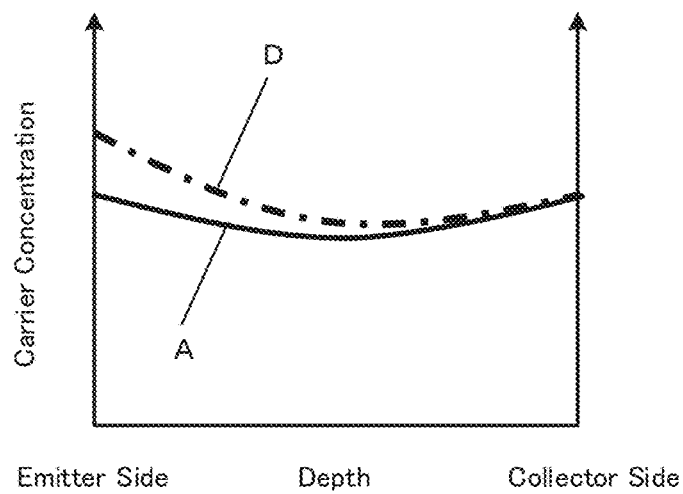

An effect of the n-type barrier layer 14 will be specifically described. FIGS. 17A, 17B are each a diagram schematically showing a distribution of a carrier concentration of the IGBT 50 in a depth direction. In FIG. 17A and FIG. 17B, the horizontal axis indicates a distance in a depth direction from the emitter electrode 11 side to the collector electrode 10 side, and the vertical axis indicates a carrier concentration. In FIG. 17A, a solid line A indicates a carrier concentration of a usual IGBT without an n-type barrier layer and an n-type storage layer, a dashed line B indicates a carrier concentration of an IGBT with an n-type barrier layer, and a dashed line C indicates a carrier concentration of an IGBT with an n-type barrier layer and an n-type storage layer. In FIG. 17B, a chain line D indicates a carrier concentration of an IGBT with only an n-type storage layer.

As shown in FIG. 17A, the carrier concentration B at the emitter side in the case with the n-type barrier layer 14 increases more than the carrier concentration A in the case without the n-type barrier layer 14. Since an effect of the n-type storage layer caused by giving the second gate voltage Vg2 to the second gate electrode 19 is added, the carrier concentration C of the IGBT with the n-type barrier layer and the n-type storage layer increases more than the carrier concentration B of the IGBT with the n-type barrier layer.

On the other hand, as shown in FIG. 17B, the carrier concentration D of the IGBT with only the n-type storage layer increases more than the carrier concentration A of the usual IGBT by the effect of the n-type storage layer caused by giving the second gate voltage Vg2 to the second gate electrode 19, but the effect of the n-type barrier layer 14 cannot be obtained.

That is, in the IGBT 50 of the embodiment, the effect of increasing the carrier concentration at the emitter side by the n-type barrier layer 14, and the effect of increasing the carrier concentration at the emitter side by the n-type storage layer generated by giving the second gate voltage Vg2 to the second gate electrode 19 are added, and accordingly, the storage of the electrons and holes in the n$^-$-type base layer 13 is promoted, and thereby a special effect that the ON resistance is remarkably reduced is obtained.

At the period of turn-off, the second gate voltage Vg2 is made low at the time t1 earlier than the first gate voltage Vg1. The second gate voltage Vg2 may be 0 V, and may be made a negative voltage. The second gate voltage Vg2 is made low earlier, and thereby the n-type storage layer formed in the n$^-$-type base layer 13 vanishes.

Accordingly, the carrier concentration at the emitter side decreases. Further, since the flow route of the holes in the n$^-$-type base layer 13 becomes large, and the holes become easy to escape into the p-type base layer 15, the storage amount of the holes in the n$^-$-type base layer 13 decreases. A term between the time t1 and the time t2 is a term in which the carrier concentration of the n$^-$-type base layer 13 is reduced due to the escape of the holes into the p-type base layer 15. During this term, since the ON resistance is even slightly increased, the collector-emitter voltage Vce is also slightly increased so as to flow the same collector current Ic.

When the first gate voltage Vg1 is made low after lapse of a prescribed time (t2−t1), the n-type channel layer is vanished, and injection of the electrons from the n$^+$-type emitter layer 16 is stopped, and accordingly, the IGBT 50 is turned off. At this time, since the second gate voltage Vg2 has previously been made low to make the carrier storage amount at the emitter side to be decreased, the IGBT 50 is turned off more quickly, and thereby the turn-off loss is reduced.

In addition, when the second gate voltage Vg2 is made a negative voltage, the p-type inversion layer is formed after the n-type storage layer formed in the n$^-$-type base layer 13 below the second gate electrode 19 has vanished. Accordingly, the holes become further easy to escape into the p-type base layer 15, and thereby this will be helpful to the improvement in the switching speed at the period of turn-off.

The reduction amount of the turn-off loss is much larger than the increase amount of the steady loss due to the increase of the collector-emitter voltage Vce so as to flow the same collector current Ic, after the second gate voltage Vg2 has been made low. For the reason, it is possible to greatly reduce the turn-off loss of the device during the whole switching operation.

Hitherto, the control method at the period of turn-off has been described. Next, a control method at the period of turn-on will be described.

Figure 18:
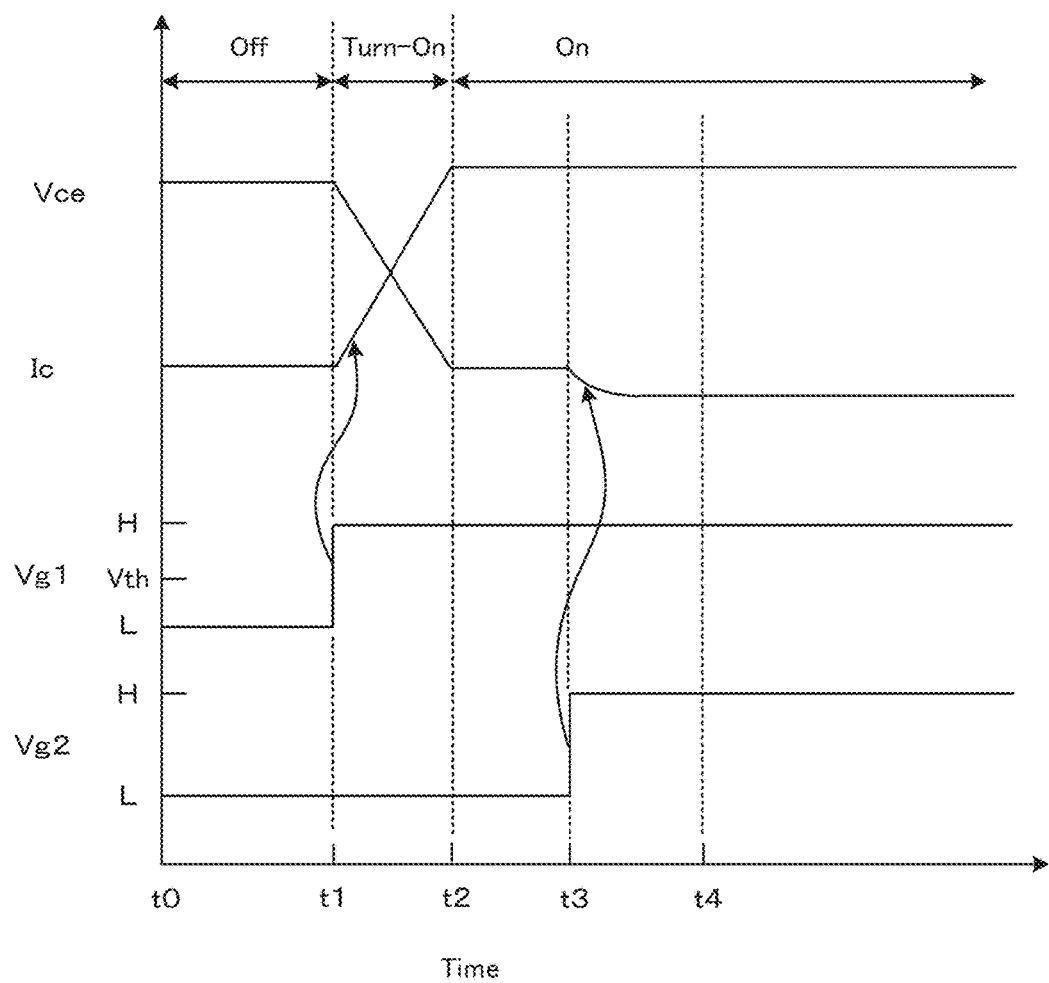
FIG. 18 is a timing chart showing a control method at the period of turn-on of the IGBT according to the seventh embodiment.

FIG. 18 is a timing chart showing a control method at the period of turn-on of the IGBT 50 of the embodiment. In FIG. 18, the horizontal axis indicates the time, and the vertical axis schematically indicates the first gate voltage Vg1 given to the first gate electrode 17, the second gate voltage Vg2 given to the second gate electrode 19, the collector-emitter voltage Vce, and the collector current Ic.

It is shown that the IGBT 50 is in the OFF state between a time t0 and a time t1, and in a term between the time t1 and a time t2, the IGBT 50 is in the turn-on term in which the IGBT 50 transfers from the OFF state to the ON state. It is shown that between the time t2 and a time t3, the IGBT 50 is in the ON state, and in a term between the time t3 and a time t4, the IGBT 50 is in the ON state, but the term is a term for adjusting the carrier concentration of the n$^-$-type base layer 13.

As shown in FIG. 18, negative voltages or zero potential are respectively given to the first gate electrode 17 and the second gate electrode 19 in the OFF state (Low). At the period of turn-on, the first gate voltage Vg1 is made the voltage (High) not less than the threshold value Vth at the time t1. The second gate voltage Vg2 is kept to be low.

When the first gate voltage Vg1 is given to the first gate electrode 17, the n-type channel layer (the inversion layer) is formed in the p-type base layer 15 in the vicinity of the gate insulating film 18 provided on the side wall of the trench 21 below the first gate electrode 17. Accordingly, electrons flow from the n$^+$-type emitter layer 16 into the n$^-$-type base layer 13 via the n-type channel layer, the n-type barrier layer 14, and holes flow from the p$^+$-type collector layer 12 into the n$^-$-type base layer 13, and the resistance value of the n$^-$-type base layer 13 is reduced due to the conductivity modulation, and thereby the IGBT 50 becomes in the ON state (conduction state).

After lapse of a prescribed time (t3−t1), the second gate voltage Vg2 is made high. The second gate voltage Vg2 has only to be a positive voltage, and is not particularly limited, but is preferably the same voltage as the first gate voltage Vg1. When the second gate voltage Vg2 is given to the second gate electrode 19, the n-type storage layer is formed in the n$^-$-type base layer 13 in the vicinity of the first insulating film 22 provided on the side wall of the trench 21 below the second gate electrode 19.

Since the storage of the carriers (electrons) at the emitter side is promoted, and also the storage of the holes in the n$^-$-type base layer 13 is promoted, by the formation of the n-type storage layer, further reduction of the ON resistance can be achieved. A term between the time t3 and the time t4 is a term in which the carrier concentration of the n$^-$-type layer 13 is increased. In the term, the collector current Ic is constant, but the collector-emitter voltage Vce is decreased, and thereby it is found that the ON resistance has reduced. Since the n-type storage layer can be controlled in accordance with the second gate voltage Vg2 given to the second gate electrode 19, the lower ON resistance can be obtained.

At the period of turn-on, since the IGBT 50 is firstly turned on only by means of the first gate electrode 17, and thereby the carriers stored in the emitter side may be small, and accordingly, the IGBT 50 can be turned on at a high speed. And after the turn-on, the second gate voltage Vg2 is applied to the second gate electrode 19, and thereby the n-type storage layer is formed in the n⁻-type base layer 13 in the vicinity of the first insulating film 22 provided on the side wall of the trench 21 to cause the further storage of the carriers at the emitter side, and accordingly the further low ON resistance can be obtained.

Figure 19:
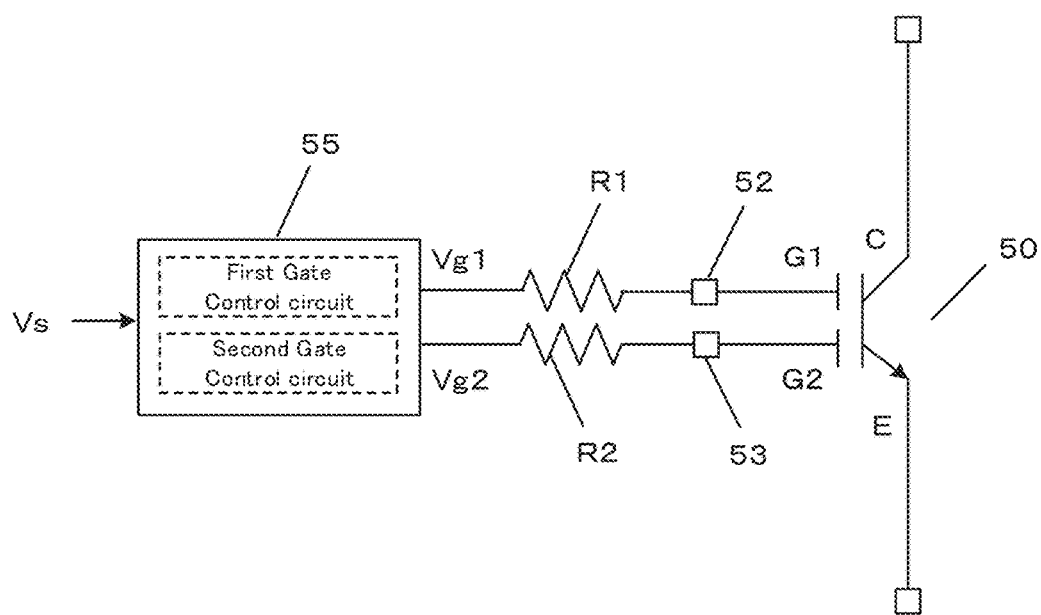
FIG. 19 is a block diagram showing a control circuit of the IGBT according to the seventh embodiment.

FIG. 19 is a block diagram showing a gate control circuit for the first gate electrode 17 and the second gate electrode 19. As shown in FIG. 19, upon receiving a control signal Vs to instruct turn-on and turn-off of the IGBT 50, a gate control circuit 55 generates the first gate voltage Vg1 and the second gate voltage Vg2 in accordance with the timing charts shown in FIG. 16 and FIG. 18.

The gate control circuit 55 has a first gate control circuit which makes the first gate voltage Vg1 high at the rise of the control signal Vs, for example, and makes the first gate voltage Vg1 low a prescribed time (t2–t1, shown in FIG. 16) later after the fall of the control signal Vs, and a second gate control circuit which makes the second gate voltage Vg2 high a prescribed time (t3–t1, shown in FIG. 18) later after the rise of the control signal Vs, and makes the second gate voltage Vg2 low at the fall of the control signal Vs. Each of the first, second gate control circuits can be configured using a Schmitt trigger, a latch, an inverter, a digital or an analog delay circuit and so on, for example. When the first, second gate voltages Vg1, Vg2 are equal to each other, the first, second gate control circuits can be commonly used except the circuits relating to delay.

A first resistor R1 is connected between the gate control circuit 55 and the first gate pad 52. The first resistor R1 is inserted for adjusting a rise timing of the first gate voltage Vg1. A second resistor R2 is connected between the gate control circuit 55 and the second gate pad 53 as well. The second resistor R2 is inserted for adjusting a rise timing of the second gate voltage Vg2. In addition, the gate control circuit 55 is operable without the first, second resistors R1, R2.

As described above, in the IGBT 50 of the embodiment, the fourth electrode 19 is made to function as the second gate electrode 19 which is controllable independently from the first gate electrode 17. In accordance with the second gate voltage Vg2 to be given to the second gate electrode 19, the n-type storage layer is formed in the n⁻-type base layer 13 in the vicinity of the first insulating film 22 provided on the side wall of the second gate electrode 19. The carrier storage amount at the emitter side and the storage amount of the holes in the n⁻-type base layer 13 can be controlled by the n-type storage layer. The storage of the carriers at the emitter side and the storage of the holes in the n⁻-type base layer 13 can be promoted by the n-type barrier layer 14.

As a result, the effect by the n-type storage layer and the effect by the n-type barrier layer 14 are combined, and thereby the further low ON resistance is obtained in the ON state, and at the period of turn-off, the turn-off loss can be more reduced. Accordingly, the IGBT with the low ON voltage and the switching loss reduced can be obtained.

Figure 9:
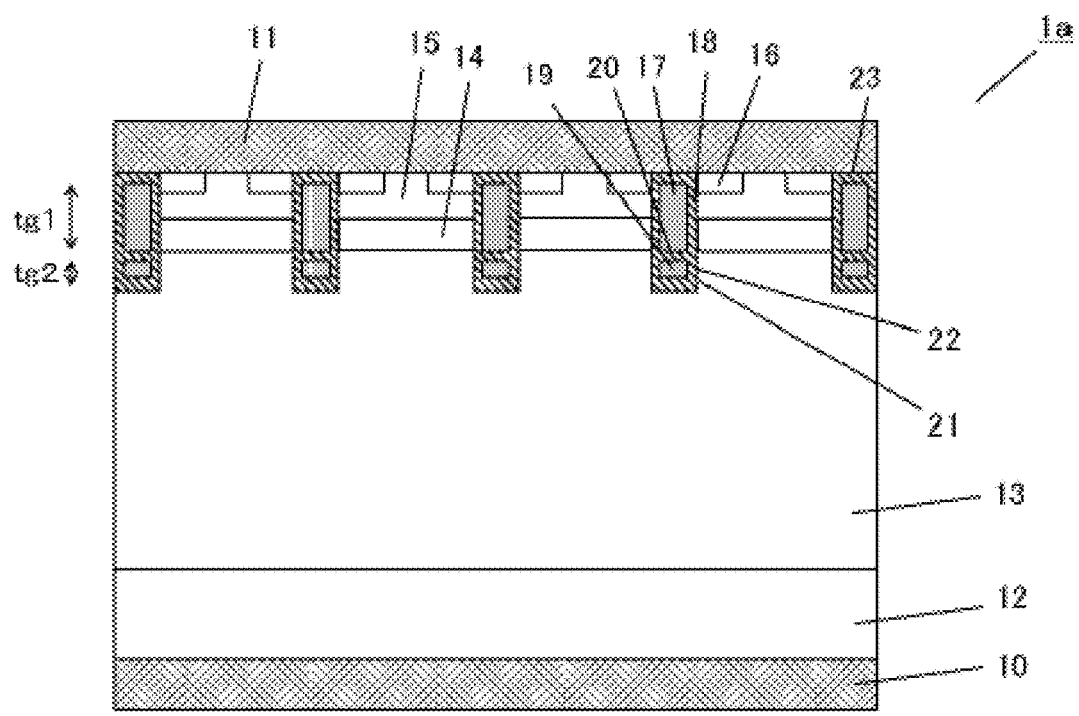
FIG. 9 is a sectional view of an IGBT according to a modification of the first embodiment.

In addition, in the IGBT 50, the length tg1 of the first gate electrode 17 can be made longer than the length tg2 of the second gate electrode 19, in the direction from the collector electrode 10 toward the emitter electrode 11, similarly as the IGBT 1a shown in FIG. 9.

In addition, here, the case in which the second gate electrode is made low earlier than the first gate electrode 17 has been described, but the order may be reversed. The second gate electrode is made low later, steep change of the voltage and current at the period of the turn-off operation is suppressed, and thereby an effect to suppress an overshoot voltage is obtained.

That is, timings at which the first gate voltage Vg1 and the second gate voltage Vg2 are given are not necessarily limited to the timings shown in FIG. 16, and FIG. 18, but can be appropriately set in accordance with the object.

(Eighth Embodiment)

Figure 20:
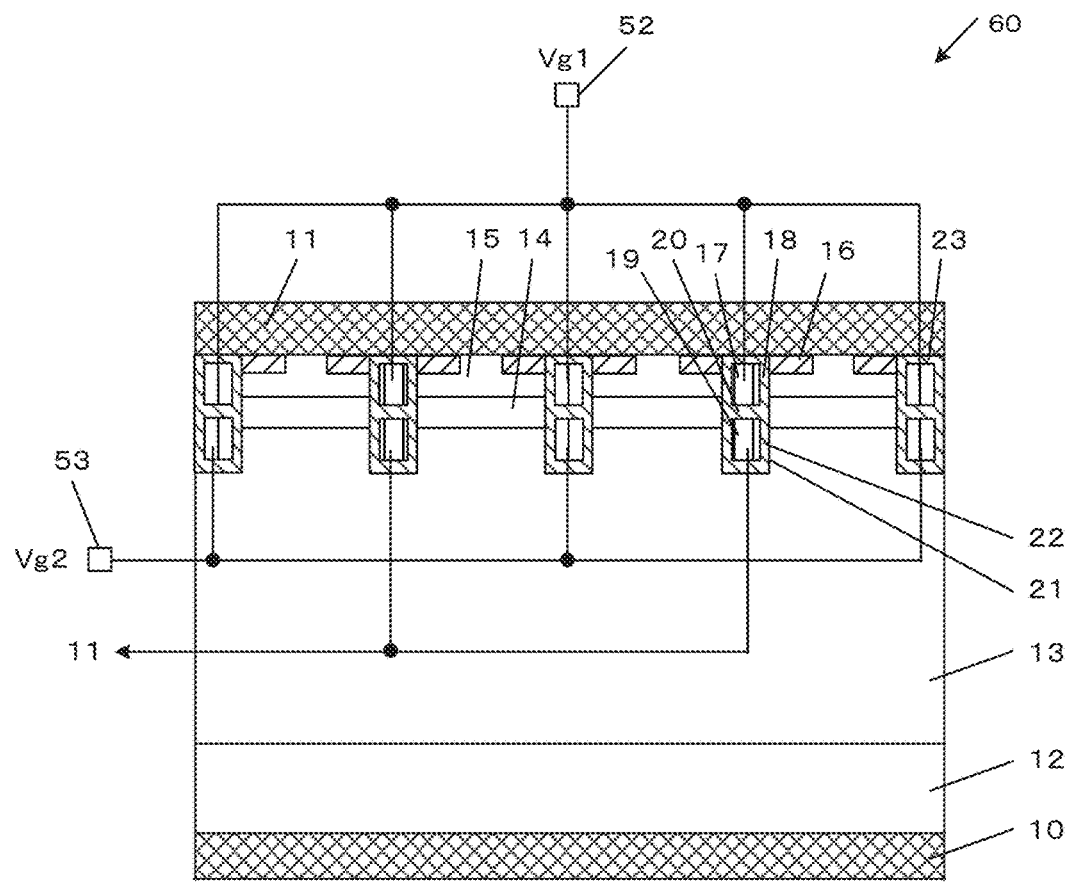
FIG. 20 is a sectional view of an IGBT according to an eighth embodiment.

An IGBT in accordance with an eighth embodiment of the invention will be described with reference to FIG. 20. FIG. 20 is a sectional view showing the IGBT in accordance with the embodiment. The description of the same portions in the embodiment as the seventh embodiment will be omitted, and different points will be described. A point in which the embodiment is different from the seventh embodiment is that each of a part of a plurality of the fourth electrodes is made to function as the gate electrode, and each of the other part of the fourth electrodes is made to function as the field plate electrode. The other points are the same as the seventh embodiment.

In other words, the IGBT in accordance with the embodiment is an IGBT in which the IGBT 1 shown in FIG. 1 and the IGBT 50 shown in FIG. 15 are mixedly mounted.

As shown in FIG. 20, in an IGBT 60 of the embodiment, the one fourth electrode 19 out of the adjacent fourth electrodes 19 is made to function as the second gate electrode, and the other fourth electrode 19 is made to function as the first field plate electrode. That is, in the sectional view of FIG. 20, the three fourth electrodes 19 which are located at the both ends and the center are made to function as the second gate electrodes 19, and the remaining fourth electrodes 19 are made to function as the first field plate electrodes. In this manner, in the embodiment, the second gate electrodes and the first field plate electrodes are alternately and adjacently provided. Here, the second gate electrodes 19 are connected to the second gate pad 53, and are given with the second gate voltage Vg2. The first field plate electrodes 19 are connected to the emitter electrode 11, and are given with the fixed emitter potential.

By means of the second gate electrode 19, the lower ON resistance is obtained in the ON state, and at the period of turn-off, the turn-off loss is more reduced. Further, by means of the first field plate electrode 19, the gate-collector capacitance Cgc is reduced, and the turn-off loss at the period of turn-off is further reduced.

As described above, in the IGBT 60 of the embodiment, the fourth electrodes 19 which have been arranged by a plural number are made to function as the second gate electrode 19 and the first field plate electrode 19, which are provided alternately and adjacently. As a result, the effect by the second gate electrode 19 and the effect by the first field plate electrode 19 can be obtained in combination. Accordingly, the IGBT with the low ON voltage and the switching loss reduced can be obtained.

In addition, it is not necessary that the second gate electrodes 19 and the first field plate electrodes 19 are arranged at a ratio of 1:1. A ratio of the arrangement can be set freely in accordance with the desired characteristics. That is, the second gate electrodes 19 and the first field plate electrodes 19 can be arranged at a ratio of n:m (n, m are positive integers).

(Ninth Embodiment)

Figure 21:
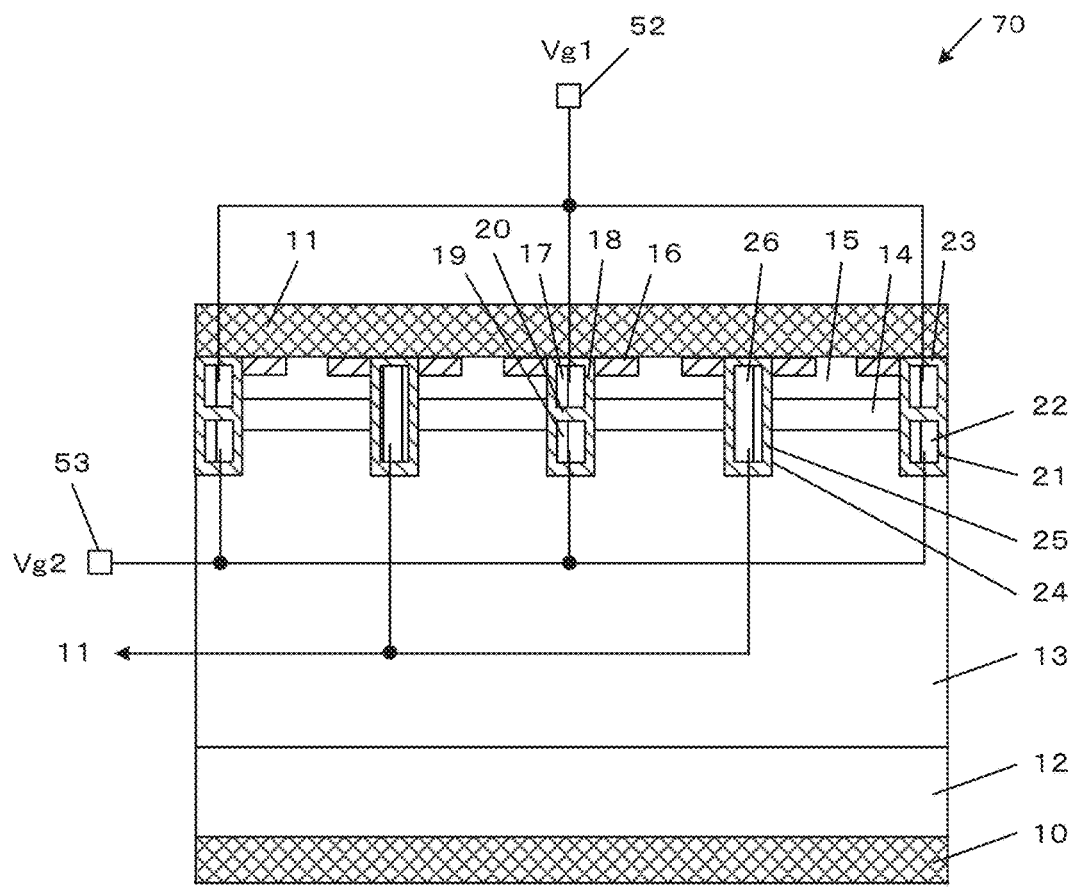
FIG. 21 is a sectional view of an IGBT according to a ninth embodiment.

An IGBT in accordance with a ninth embodiment of the invention will be described with reference to FIG. 21. FIG. 21 is a sectional view showing the IGBT in accordance with the embodiment. The description of the same portions in the embodiment as the seventh embodiment will be omitted, and the different points will be described. A point in which the embodiment is different from the seventh embodiment is that second field plate electrodes are provided so as to be opposite to the first, the second gate electrodes. The other points are the same as the seventh embodiment.

That is, as shown in FIG. 21, an IGBT 70 of the embodiment is provided with the second field plate electrode 26 (the fifth electrode) which is provided on the n⁻-type base layer 13, the n-type barrier layer 14, and the p-type base layer 15 via the second insulating film 25 and opposite to the first gate electrode 17 and the second gate electrode 19, and is electrically connected to the emitter electrode 11.

The second field plate electrode 26 is embedded in the trench 24 which extends from the emitter electrode 11 side into the n⁻-type base layer 13 through the p-type base layer 15 and the n-type barrier layer 14 via the second insulting film 25.

The second field plate electrode 26 has a larger lateral area than the first field plate electrode 19, and thereby the field plate electrode comes to be equivalently increased in the IGBT 70. The second field plate electrode 26 has a higher shielding effect than the first field plate electrode 19. Since the gate-collector capacitance Cgc is more decreased by means of the second field plate electrode 26, it is possible to further reduce the turn-off loss at the period of turn-off.

As described above, the IGBT 70 of the embodiment has the second field plate electrode 26 having the higher shielding effect than the first field plate electrode 19. As a result, the gate-collector capacitance Cgc is reduced, and the turn-off loss at the period of turn-off can be reduced. Accordingly, the IGBT with the low ON voltage and the switching loss reduced can be obtained.

Figure 10:
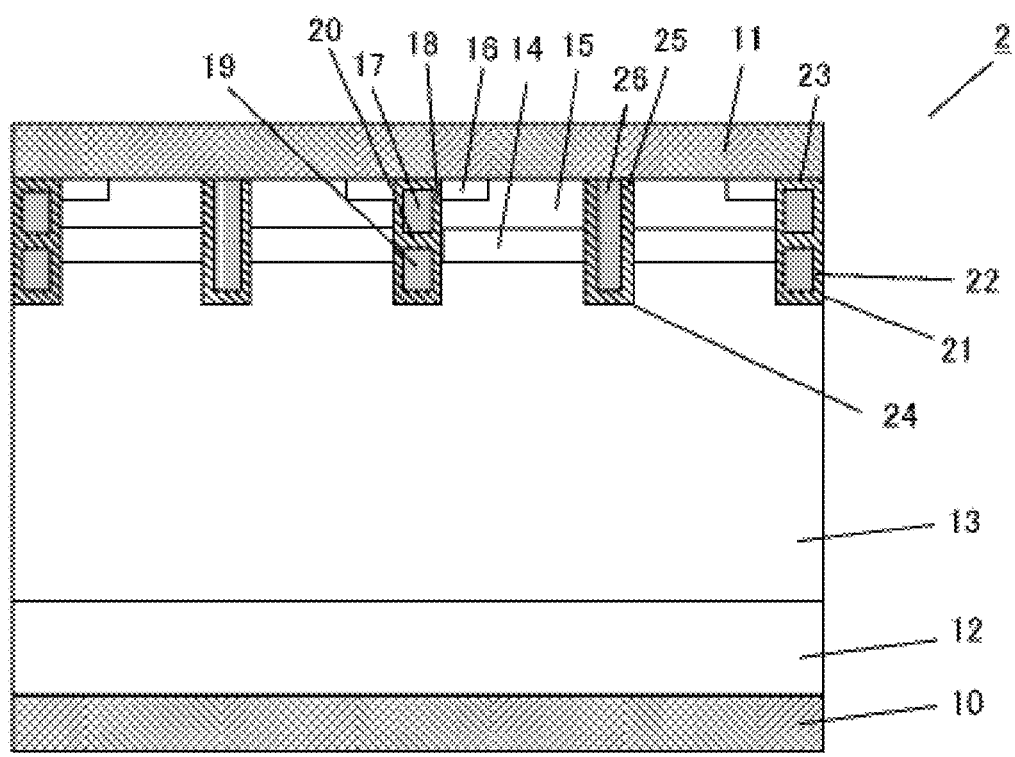
FIG. 10 is a sectional view of an IGBT according to a second embodiment.

In addition, a distance between an end of the second gate electrode 19 at the collector electrode 10 side and the emitter electrode 11 can be made the same as a distance between an end of the second field plate electrode 26 at the collector electrode 10 side and the emitter electrode 11, similarly as the IGBT 2 shown in FIG. 10, In addition, it is not necessary that the first, second gate electrodes 17, 19 and the second field plate electrodes 26 are arranged at a ratio of 1:1. A ratio of the arrangement can be set freely in accordance with the desired characteristics. That is, the first, second gate electrodes 17, 19 and the second field plate electrodes 26 can be arranged at a ratio of n:m (n, m are positive integers).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An insulated gate bipolar transistor comprising:
a first electrode;
a second electrode;
a first semiconductor layer of a first conductivity type between the first electrode and the second electrode;
a second semiconductor layer of a second conductivity type between the second electrode and the first semiconductor layer;
a third semiconductor layer of the second conductivity type having a higher impurity concentration than the second semiconductor layer between the second electrode and the second semiconductor layer;
a fourth semiconductor layer of the first conductivity type which is provided between the second electrode and the third semiconductor layer, and is electrically connected to the second electrode;
a fifth semiconductor layer of the second conductivity type having a higher impurity concentration than the second semiconductor layer which is selectively provided between the second electrode and the fourth semiconductor layer, and is electrically connected to the second electrode;
a third electrode which is provided on the third semiconductor layer, the fourth semiconductor layer, and the fifth semiconductor layer via a gate insulating film, and is insulated from the first electrode and the second electrode; and
a fourth electrode which is provided at least on the third electrode and the second semiconductor layer, via an insulating film, wherein the third gate electrode and the fourth electrode are electrically separated from each other, and are configured to be given with control voltages independently, and wherein at the period of a turn-on operation or a turn-off operation, the fourth electrode and the third electrode are given with voltages at a prescribed time interval.

2. The insulated gate bipolar transistor according to claim 1, wherein the fourth electrode is further provided on the third semiconductor layer via the insulating film.

3. The insulated gate bipolar transistor according to claim 1, wherein a length of the third electrode is longer than a length of the fourth electrode in a direction from the first electrode toward the second electrode.

4. The insulated gate bipolar transistor according to claim 1, wherein the third electrodes and the fourth electrodes are respectively provided by plural numbers, and each of a part of the fourth electrodes is electrically connected to the second electrode.

5. The insulated gate bipolar transistor according to claim 1, further comprising:
a fifth electrode which is provided on the second semiconductor layer, the third semiconductor layer, and the fourth semiconductor layer via an insulating film, and opposite to the third electrode and the fourth electrode, and is electrically connected to the second electrode.

6. The insulated gate bipolar transistor according to claim 5, wherein a distance between an end at the first electrode side of the fourth electrode and the second electrode is equal to a distance between an end at the first electrode side of the fifth electrode and the second electrode.

7. The insulated gate bipolar transistor according to claim 1, wherein the fifth semiconductor layers are provided by a plural number, and the plurality of fifth semiconductor layers are separated in an extending direction of the third electrode and the fourth electrode.

* * * * *